US012721139B2

(12) United States Patent
Chuang

(10) Patent No.: US 12,721,139 B2
(45) Date of Patent: Aug. 25, 2026

(54) CONTACT STRUCTURE, SEMICONDUCTOR DEVICE WITH THE SAME, AND METHOD FOR FABRICATING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 370 days.

(21) Appl. No.: 18/599,254

(22) Filed: Mar. 8, 2024

(65) Prior Publication Data

US 2025/0253248 A1 Aug. 7, 2025

Related U.S. Application Data

(62) Division of application No. 18/433,904, filed on Feb. 6, 2024.

(51) Int. Cl.
*H10W 20/20* (2026.01)
*H10W 20/00* (2026.01)
*H10W 20/40* (2026.01)

(52) U.S. Cl.
CPC ......... *H10W 20/20* (2026.01); *H10W 20/032* (2026.01); *H10W 20/056* (2026.01); *H10W 20/40* (2026.01)

(58) Field of Classification Search
CPC ..................................................... H10W 20/20
(Continued)

(56) References Cited

U.S. PATENT DOCUMENTS

2010/0032790 A1* 2/2010 Rinehimer ........... H10D 84/146 257/E29.338
2014/0231892 A1 8/2014 Song et al.
(Continued)

FOREIGN PATENT DOCUMENTS

TW 200839957 A 10/2008
TW 201901935 A 1/2019
(Continued)

OTHER PUBLICATIONS

Office Action and and the search report mailed on May 26, 2025 related to Taiwanese Application No. 113114117.
(Continued)

*Primary Examiner* — Igwe U Anya
(74) *Attorney, Agent, or Firm* — Xuan Zhang

(57) ABSTRACT

The present application discloses a cell contact structure, a semiconductor device, and a method for fabricating the semiconductor device. The cell contact structure includes a bottom contact layer positioned on a substrate and enclosed by a plurality of bit line structures and a plurality of partition layers; a liner layer positioned between the bottom contact layer and the substrate, between the bottom contact layer and the plurality of bit line structures, and between the bottom contact layer and the plurality of partition layers; and a top contact layer positioned on the bottom contact layer and the liner layer. A top surface of the bottom contact layer and a top surface of the liner layer are substantially coplanar. The liner layer includes doped polycrystalline silicon, doped polycrystalline germanium, or doped polycrystalline silicon germanium. The bottom contact layer includes tungsten, titanium, or titanium nitride.

10 Claims, 32 Drawing Sheets

(58) Field of Classification Search
USPC .......................................................... 257/741
See application file for complete search history.

(56) References Cited

U.S. PATENT DOCUMENTS

| | | | | |
|---|---|---|---|---|
| 2016/0049409 | A1 | 2/2016 | Yeom et al. | |
| 2021/0273102 | A1* | 9/2021 | Su | H10D 30/0241 |
| 2021/0351185 | A1* | 11/2021 | Huang | H10B 12/482 |
| 2022/0122982 | A1* | 4/2022 | Shih | H10B 12/315 |
| 2022/0310800 | A1* | 9/2022 | Khaderbad | H10D 62/83 |

FOREIGN PATENT DOCUMENTS

| | | | |
|---|---|---|---|
| TW | 202111865 | A | 3/2021 |
| TW | 202320305 | A | 5/2023 |
| TW | 202331944 | A | 8/2023 |
| TW | 202336848 | A | 9/2023 |

OTHER PUBLICATIONS

Summary translation of Office Action and and the search report mailed on May 26, 2025 related to Taiwanese Application No. 113114117.

Office Action and and the search report mailed on Jan. 20, 2025 related to Taiwanese Application No. 113114117.

Summary translation of Office Action and and the search report mailed on Jan. 20, 2025 related to Taiwanese Application No. 113114117.

Office Action and and the search report mailed on Nov. 20, 2025 related to Taiwanese Application No. 114100938.

Summary translation of Office Action and and the search report mailed on Nov. 20, 2025 related to Taiwanese Application No. 114100938.

* cited by examiner

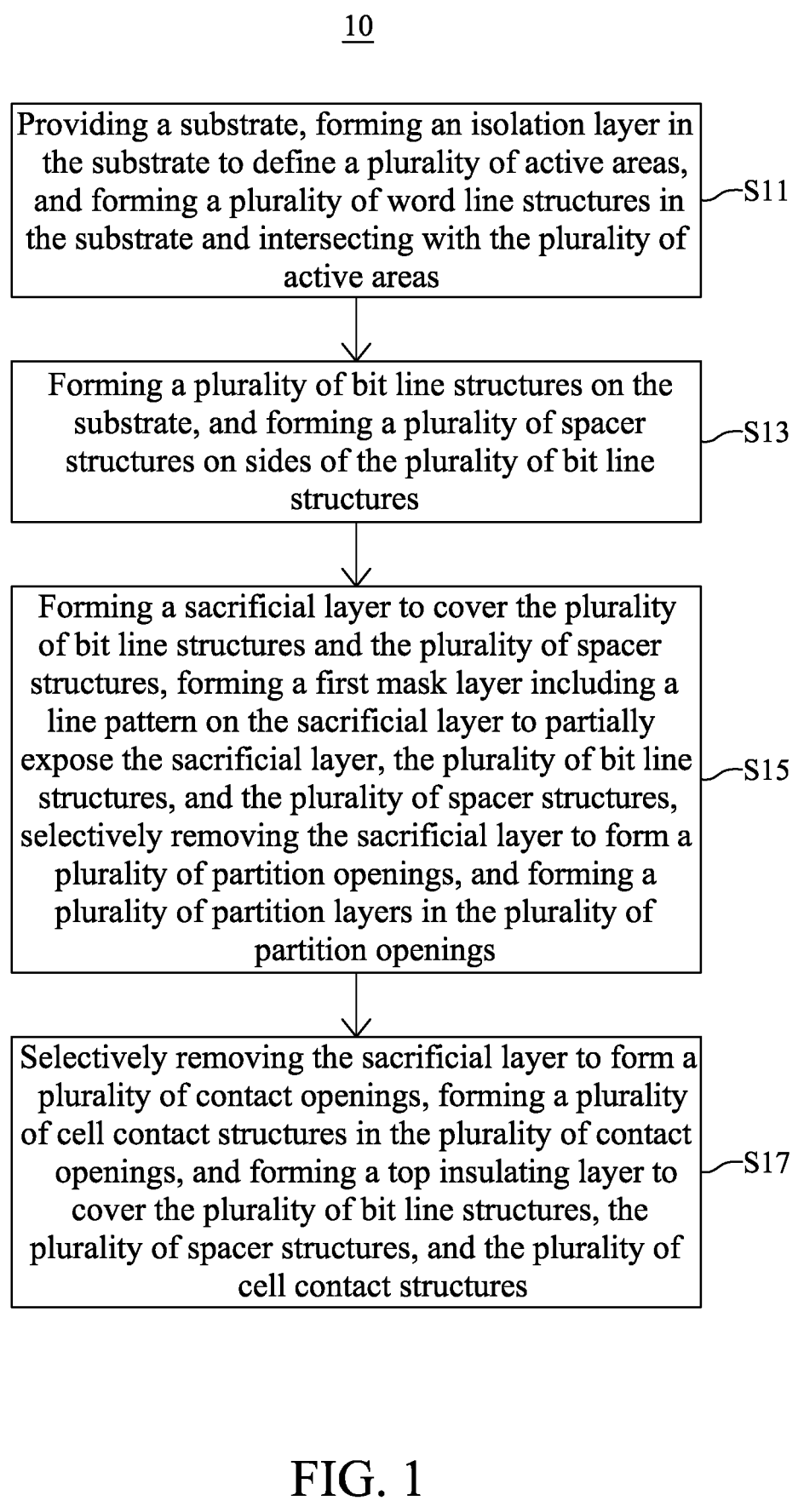

10

Providing a substrate, forming an isolation layer in the substrate to define a plurality of active areas, and forming a plurality of word line structures in the substrate and intersecting with the plurality of active areas — S11

Forming a plurality of bit line structures on the substrate, and forming a plurality of spacer structures on sides of the plurality of bit line structures — S13

Forming a sacrificial layer to cover the plurality of bit line structures and the plurality of spacer structures, forming a first mask layer including a line pattern on the sacrificial layer to partially expose the sacrificial layer, the plurality of bit line structures, and the plurality of spacer structures, selectively removing the sacrificial layer to form a plurality of partition openings, and forming a plurality of partition layers in the plurality of partition openings — S15

Selectively removing the sacrificial layer to form a plurality of contact openings, forming a plurality of cell contact structures in the plurality of contact openings, and forming a top insulating layer to cover the plurality of bit line structures, the plurality of spacer structures, and the plurality of cell contact structures — S17

FIG. 1

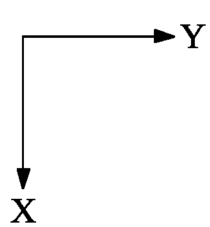
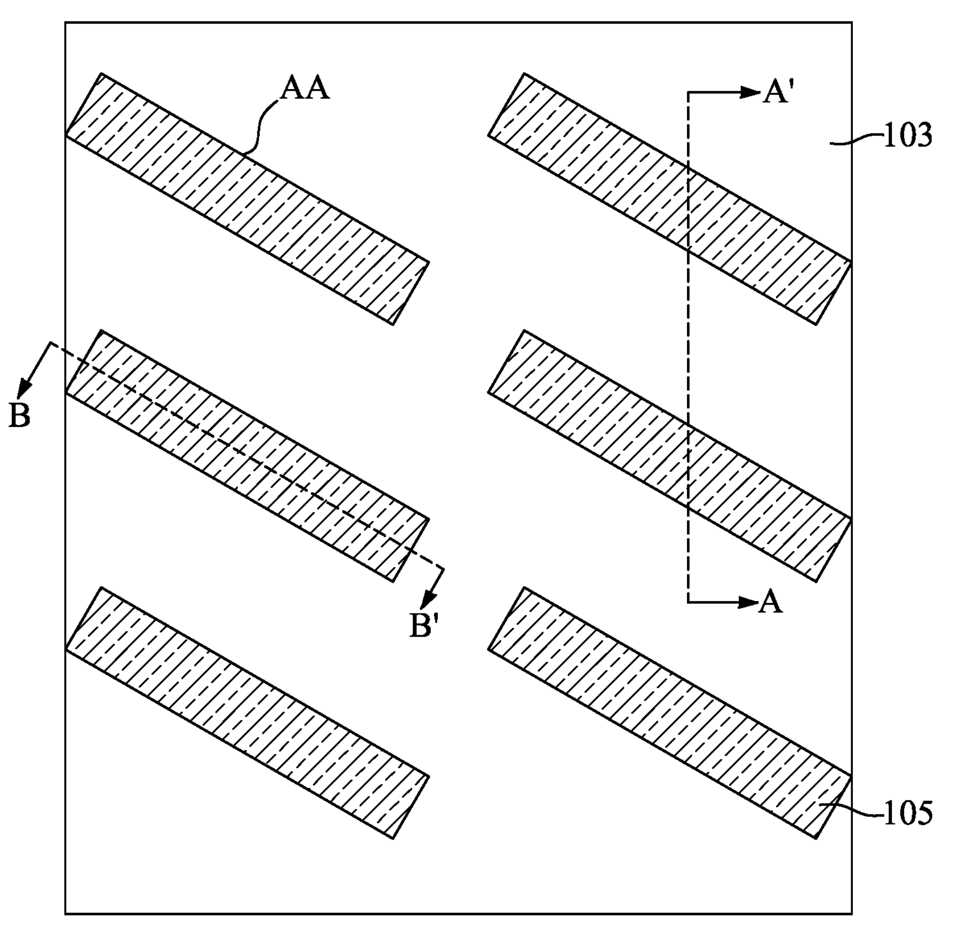
FIG. 2

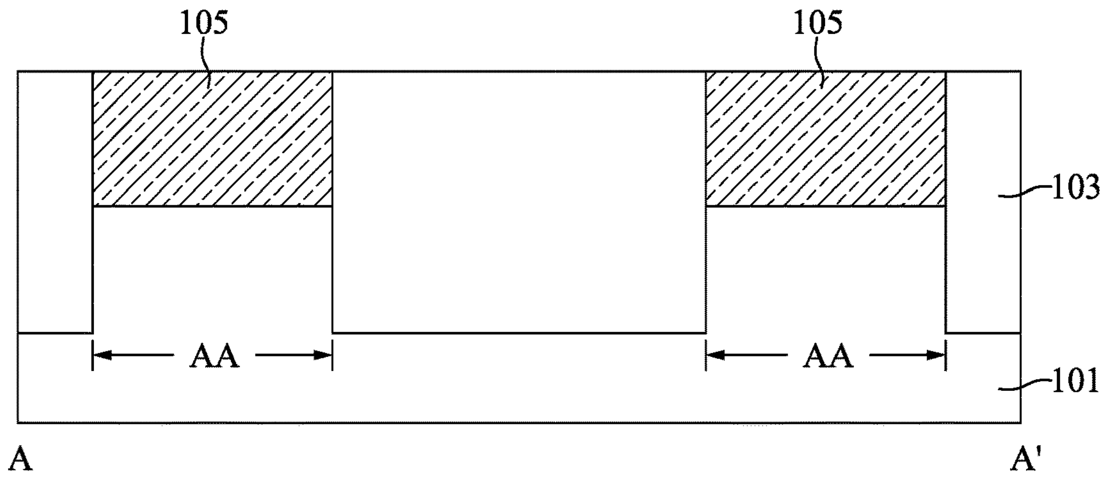
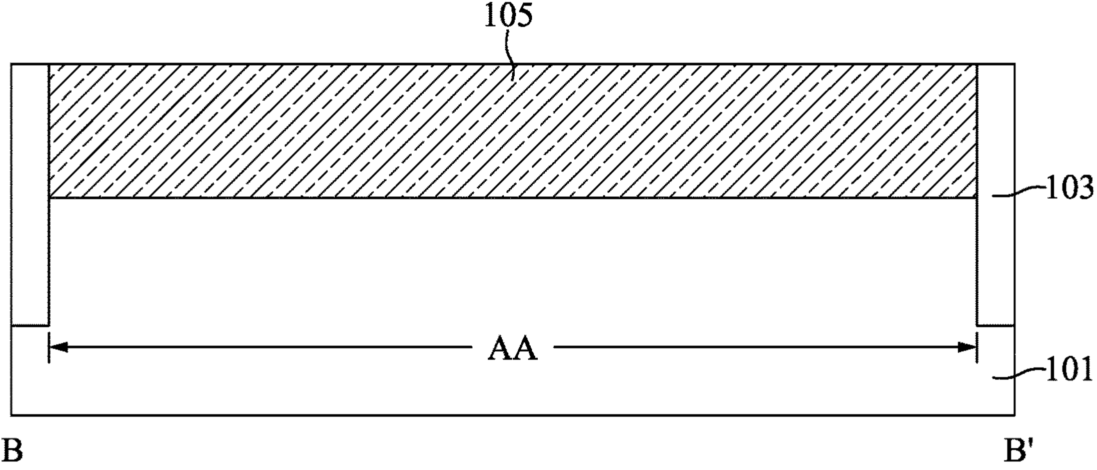
FIG. 3

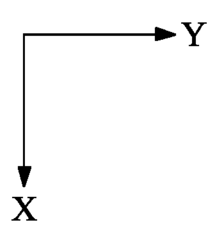
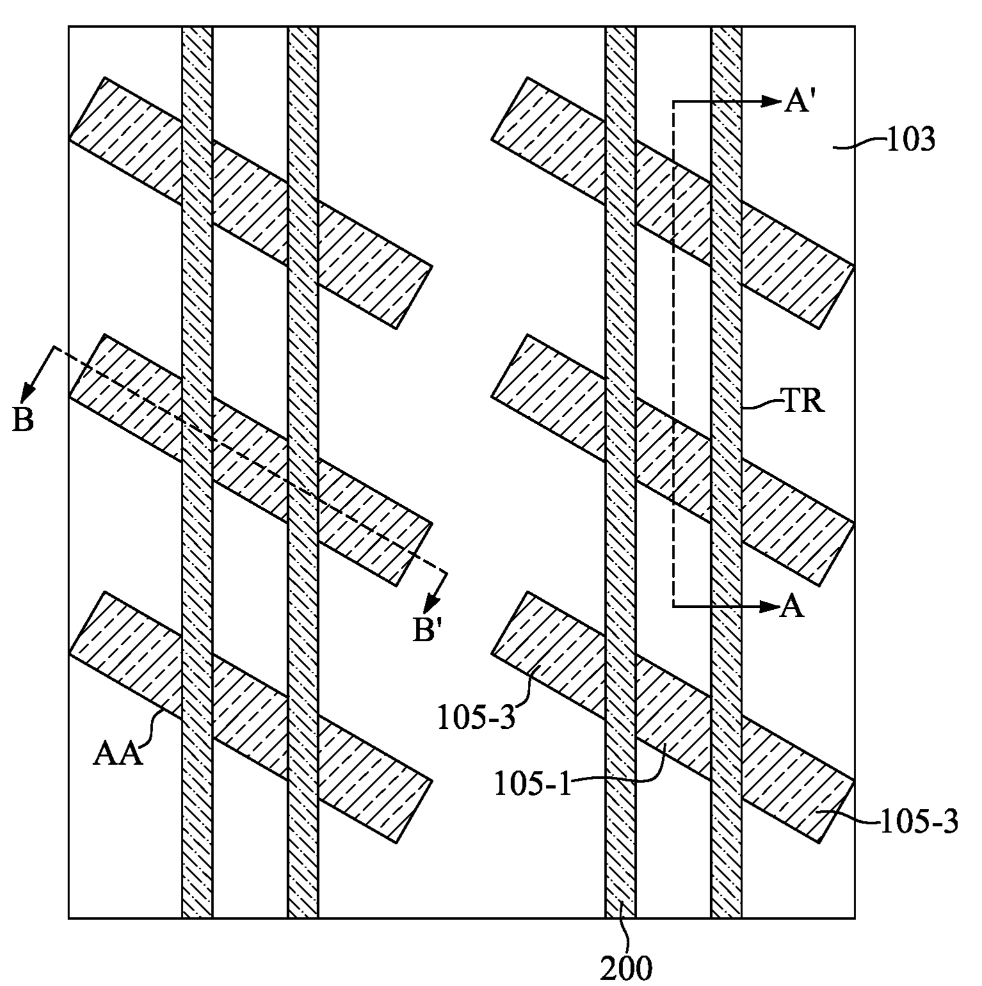
FIG. 4

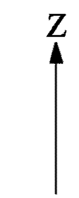
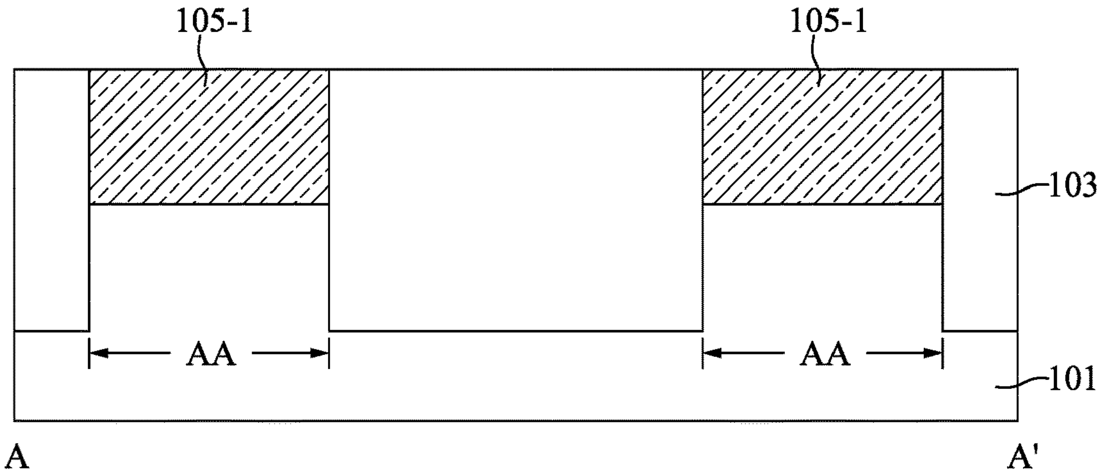
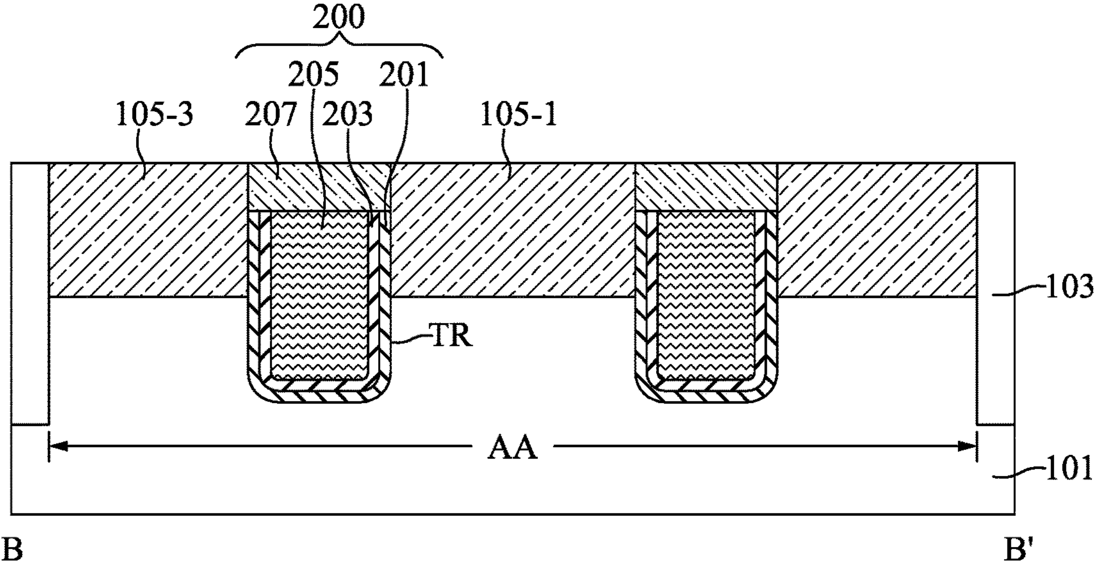
FIG. 5

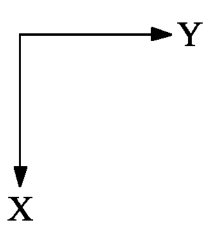
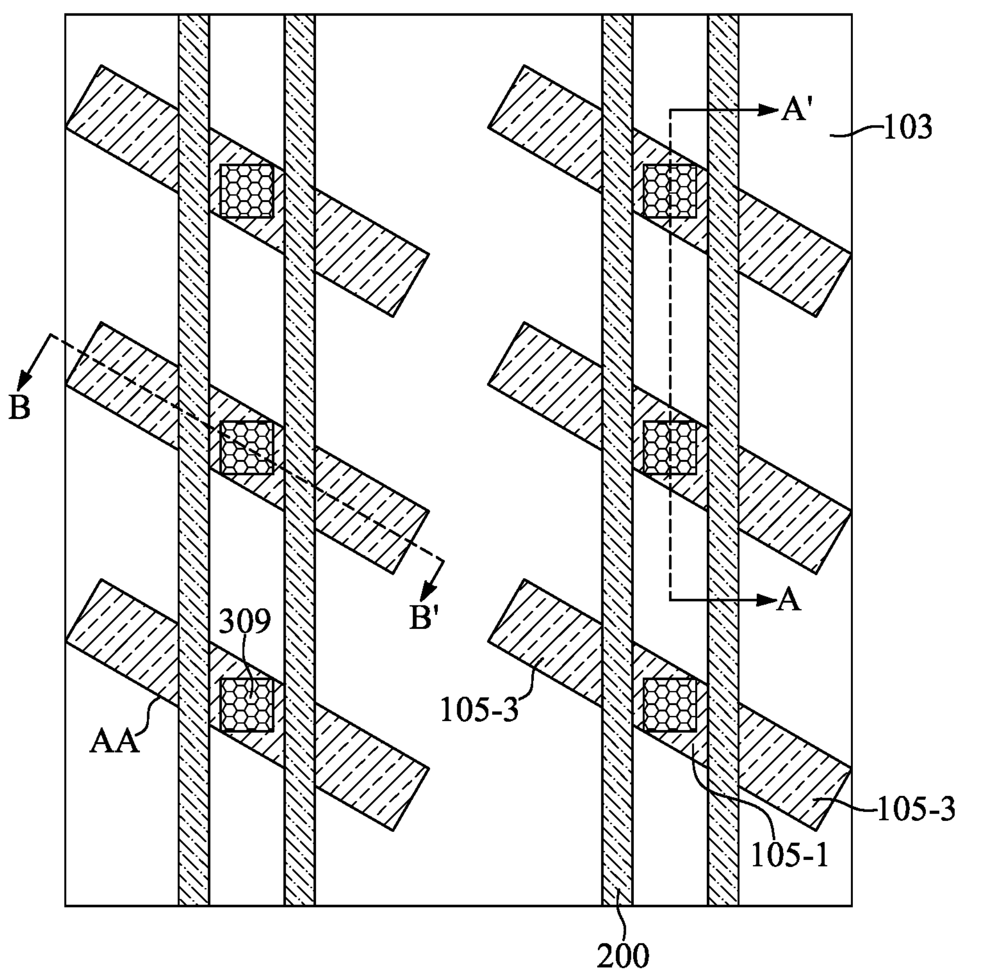
FIG. 6

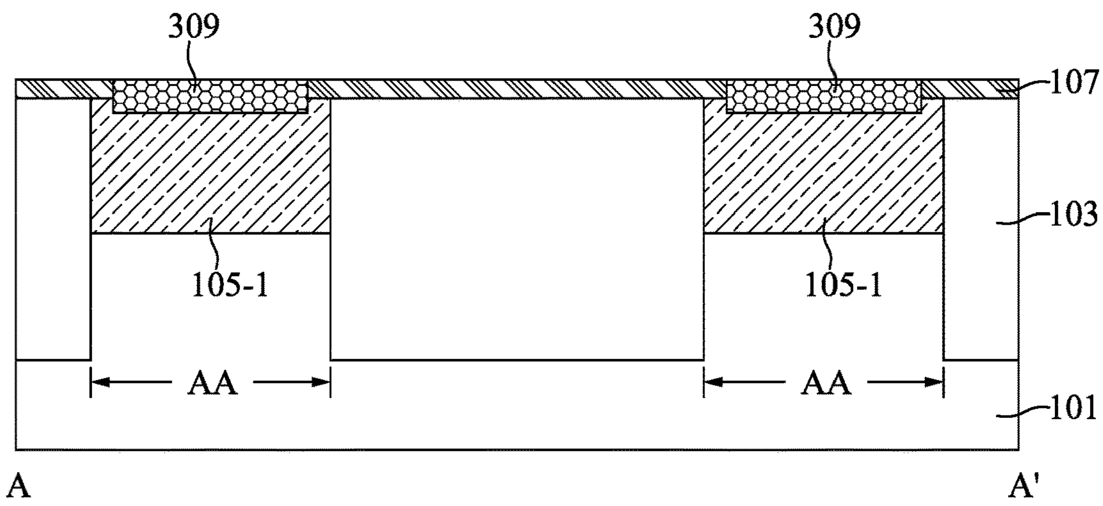
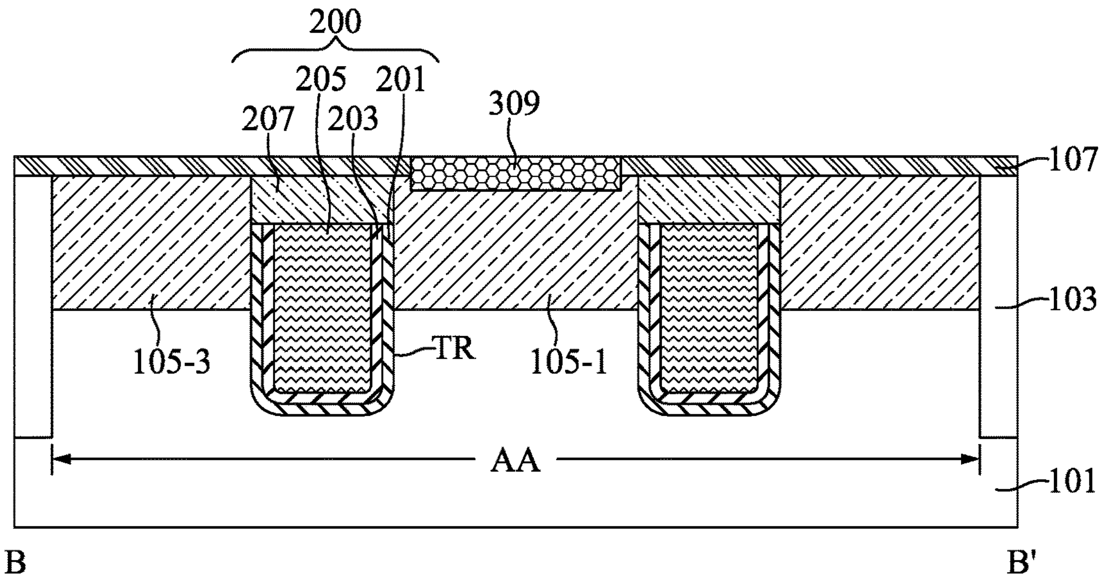
FIG. 7

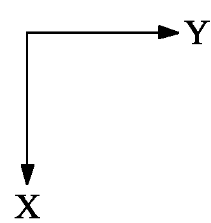
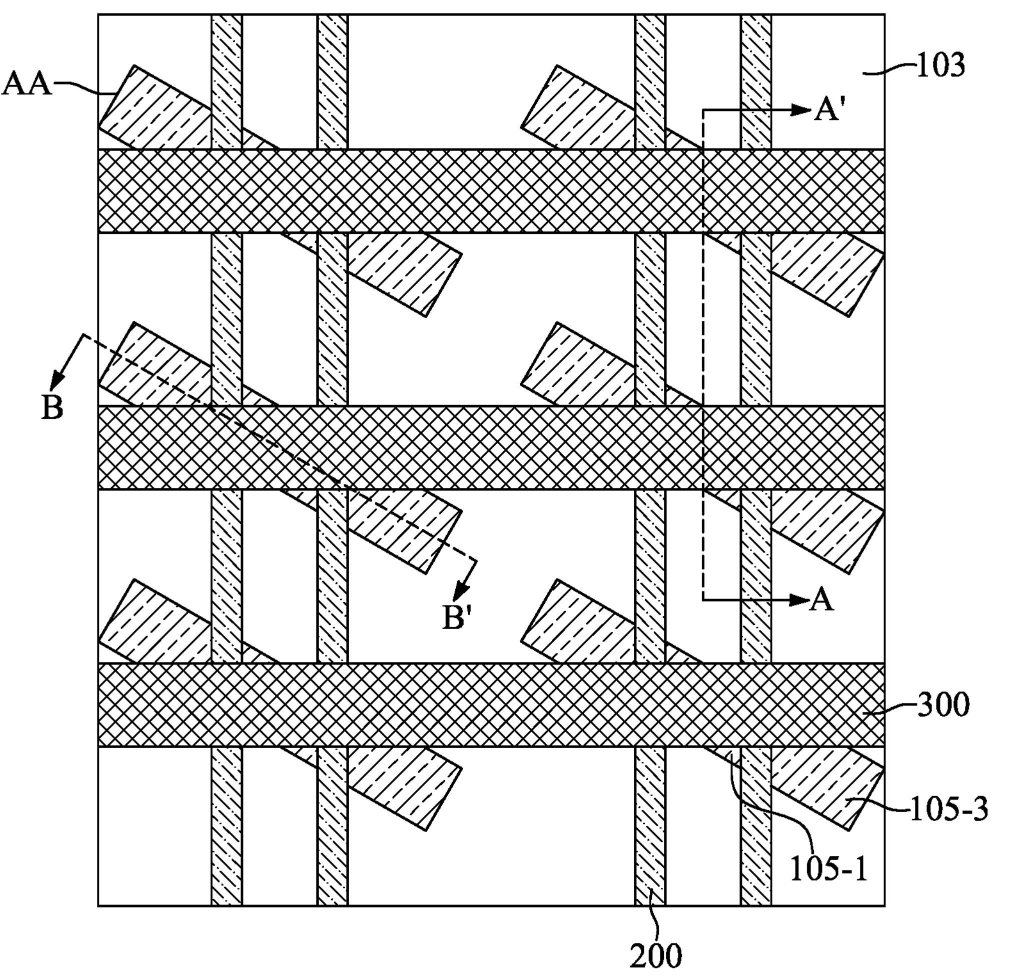
FIG. 8

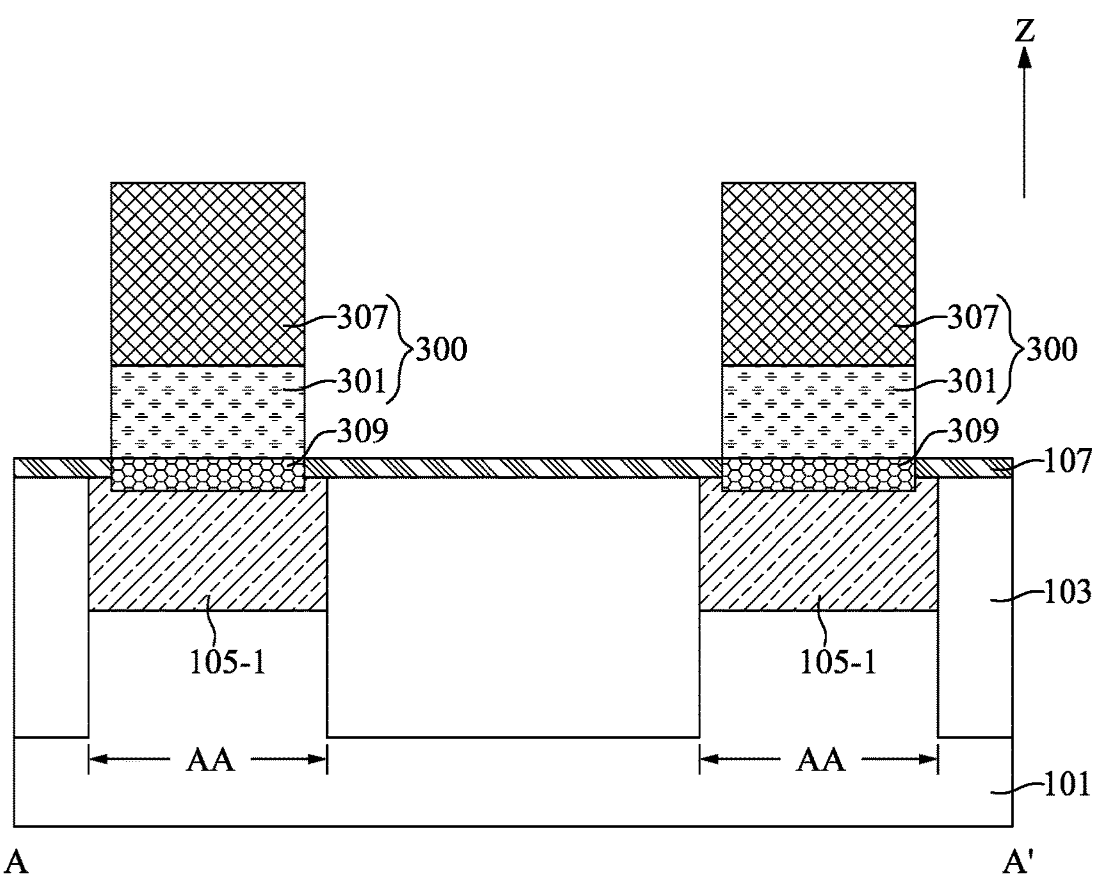
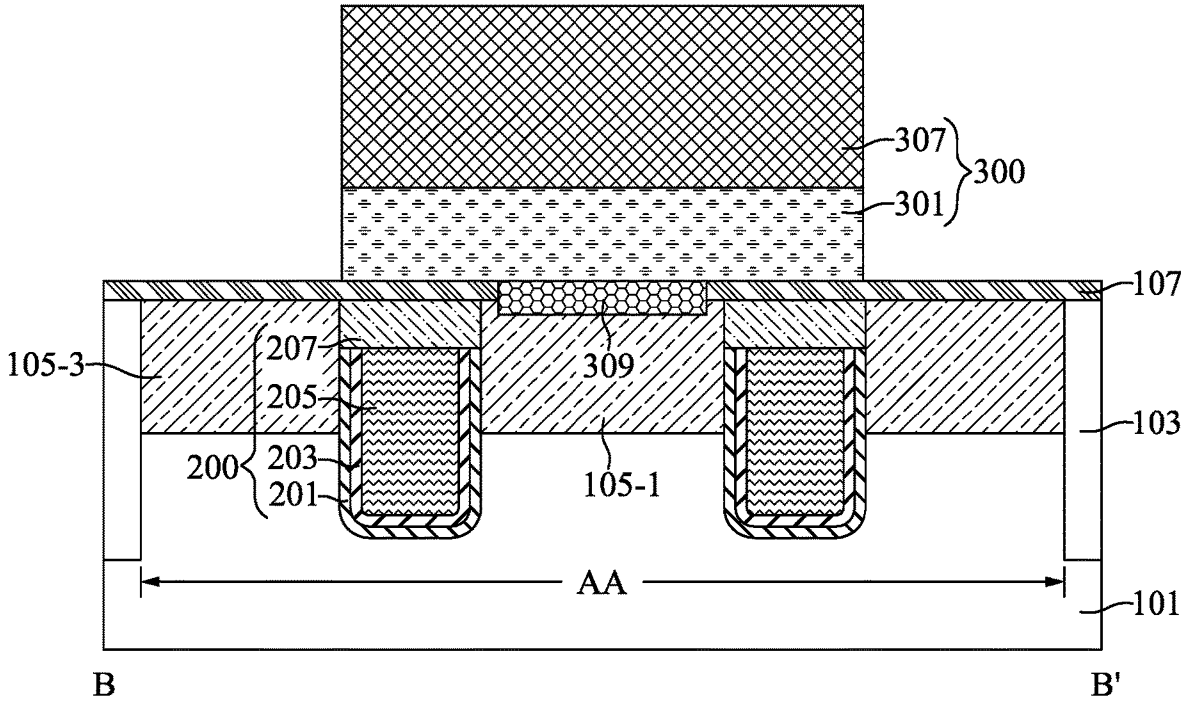
FIG. 9

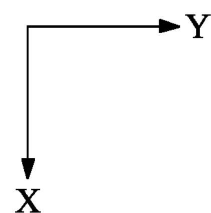
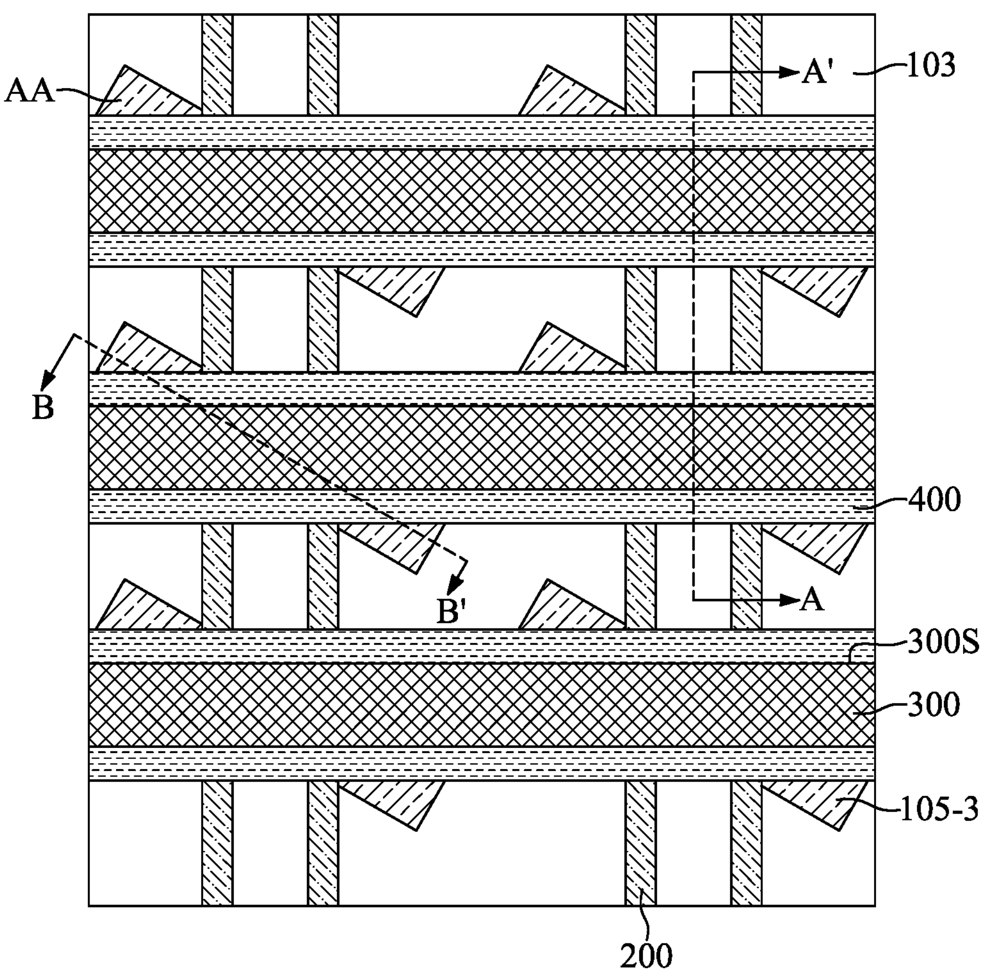
FIG. 10

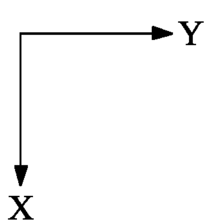
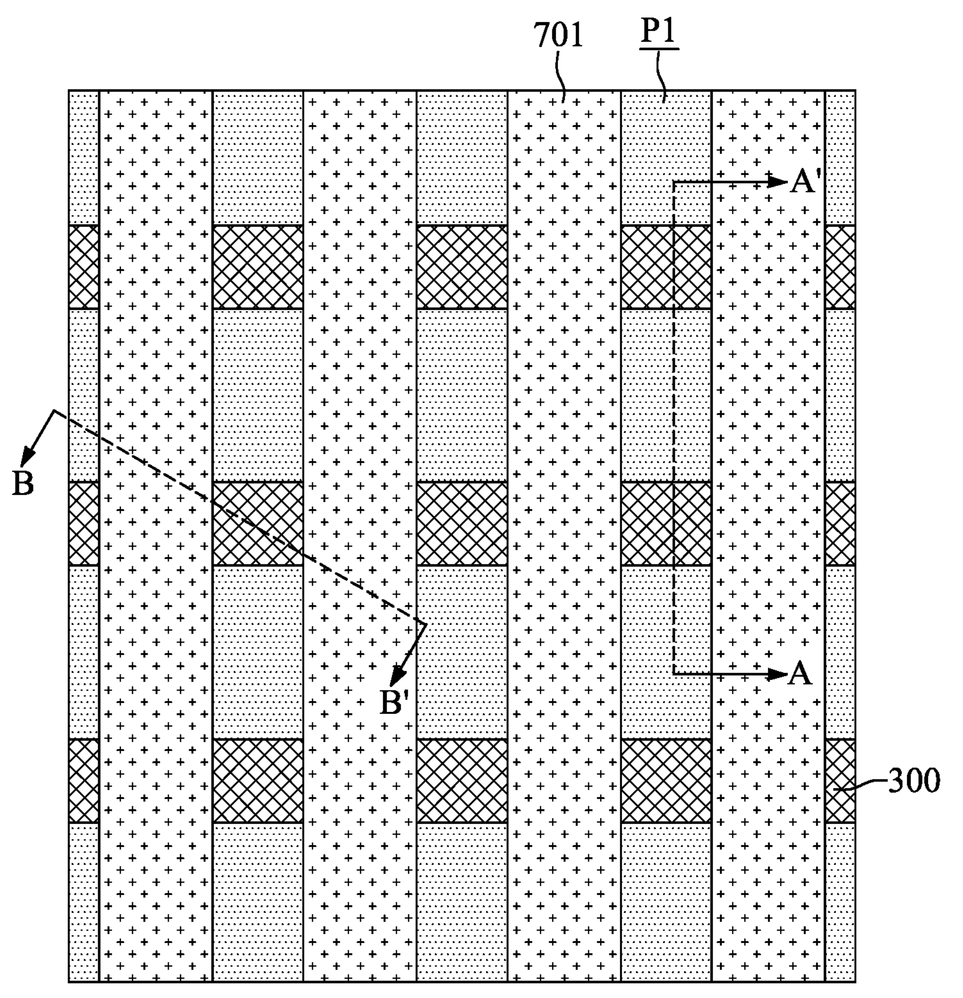
FIG. 12

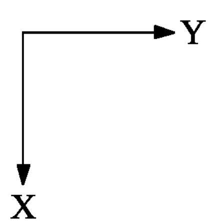
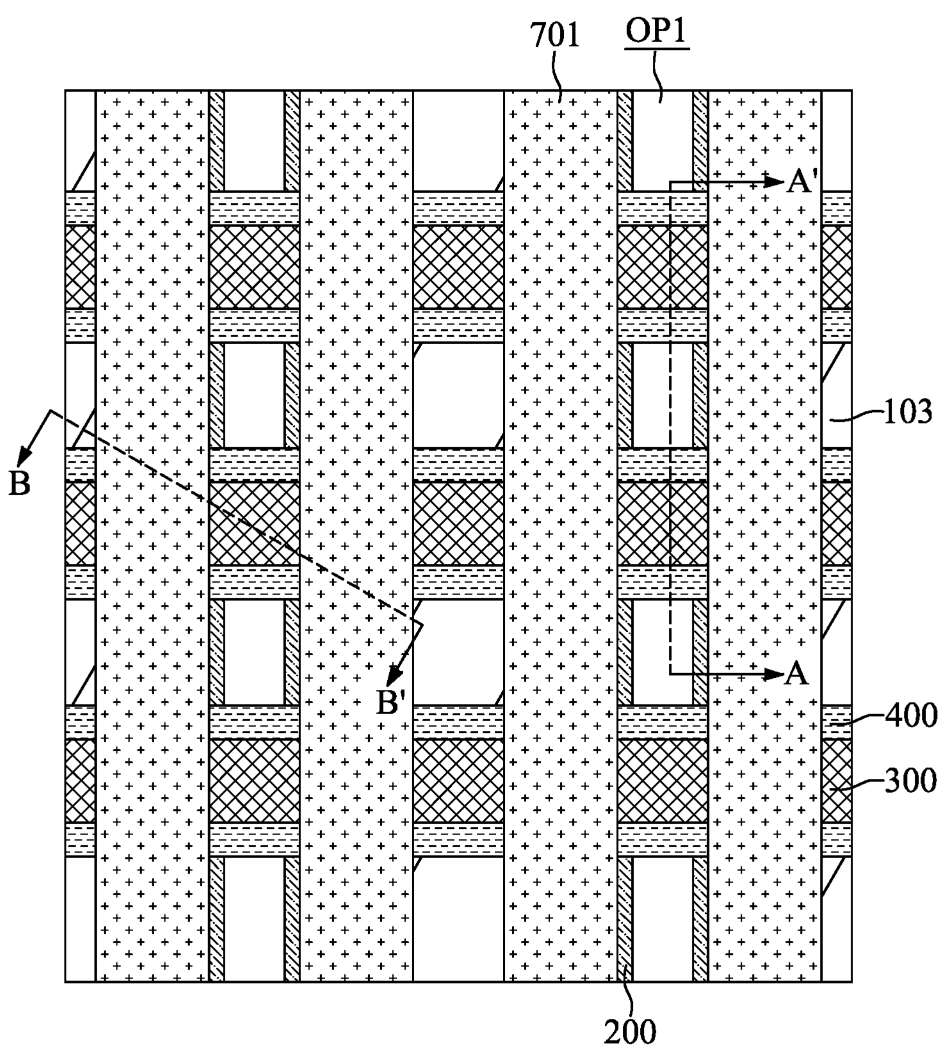
FIG. 14

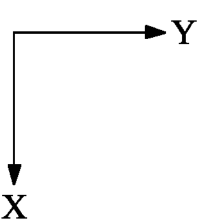
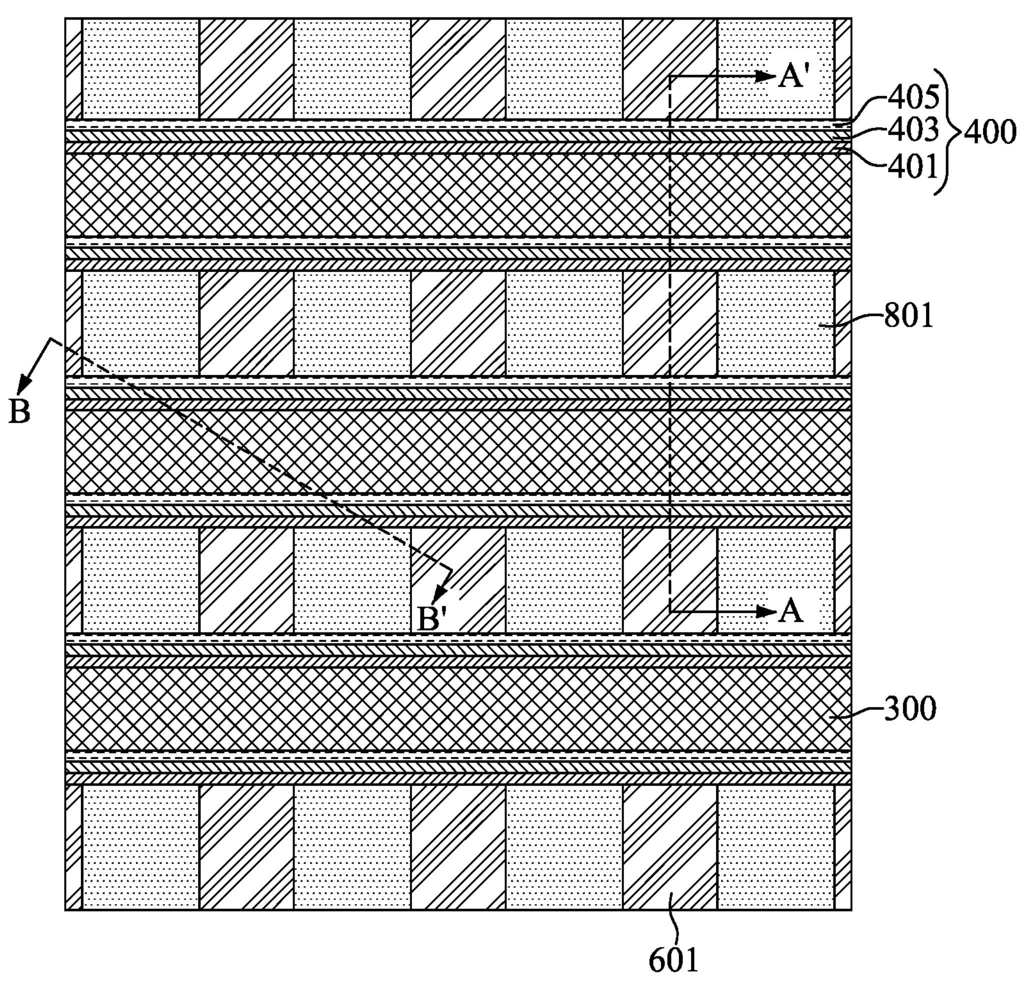
FIG. 17

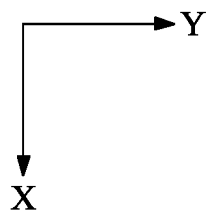
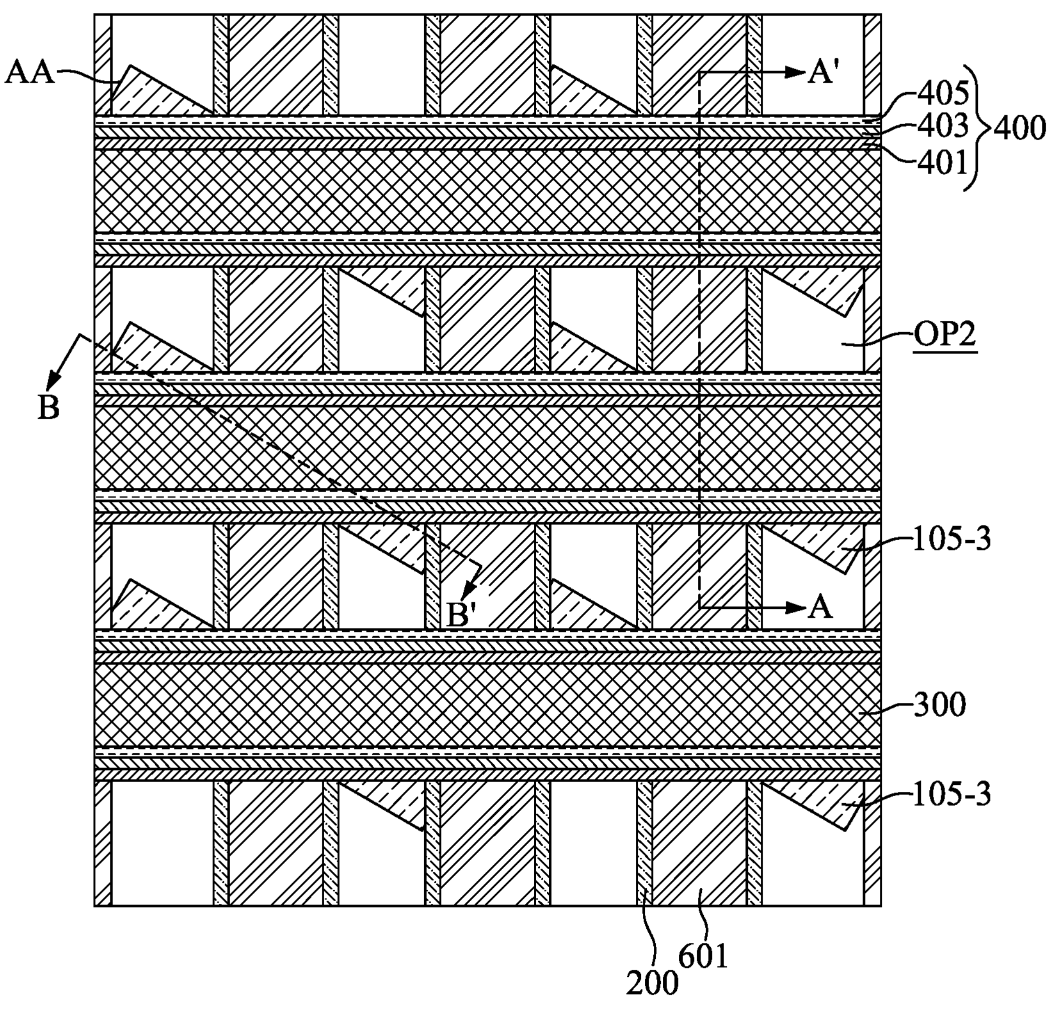
FIG. 19

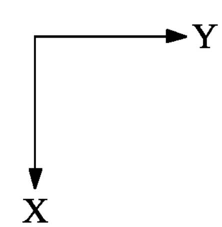
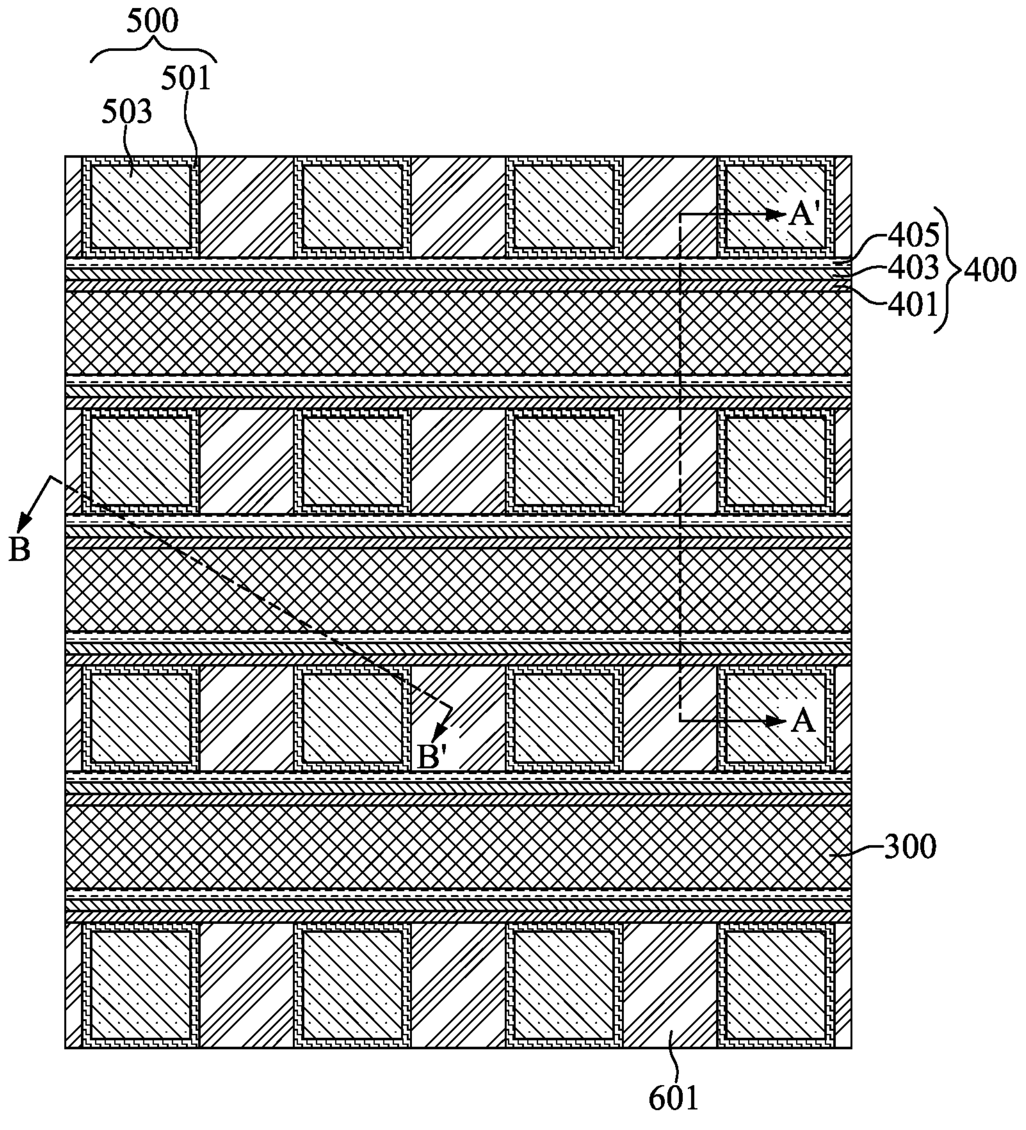
FIG. 24

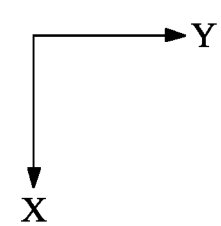
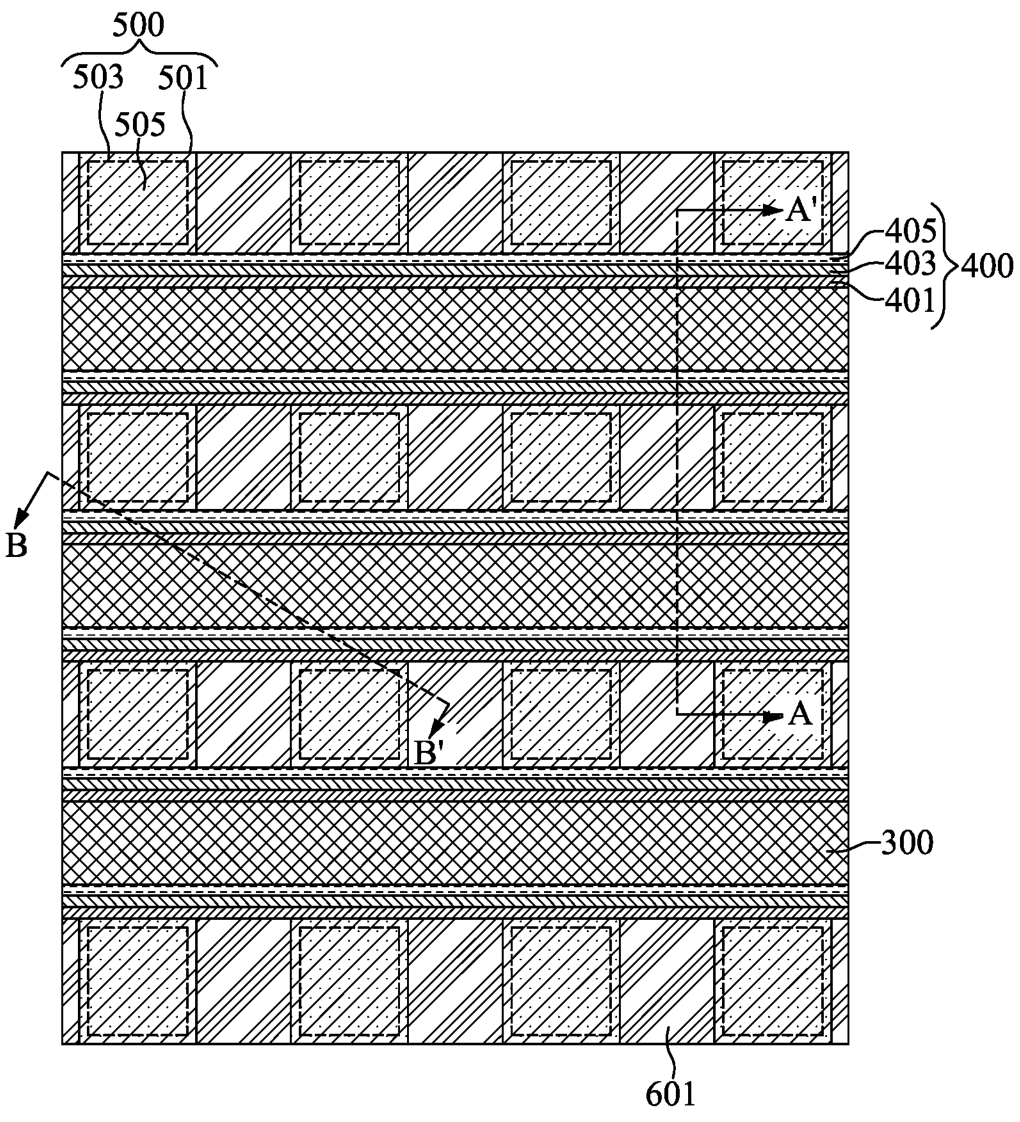
FIG. 27

CONTACT STRUCTURE, SEMICONDUCTOR DEVICE WITH THE SAME, AND METHOD FOR FABRICATING THE SAME

CROSS-REFERENCE TO RELATED APPLICATION

This application is a divisional application of U.S. Non-Provisional application Ser. No. 18/433,904 filed Feb. 6, 2024, which is incorporated herein by reference in its entirety.

TECHNICAL FIELD

The present disclosure relates to a cell contact structure, a semiconductor device, and a method for fabricating the semiconductor device, and more particularly, to the cell contact structure with a cell contact structure with a liner layer, the semiconductor device with the cell contact structure, and the method for fabricating the semiconductor device with the cell contact structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a cell contact structure including a bottom contact layer positioned on a substrate and enclosed by a plurality of bit line structures and a plurality of partition layers; a liner layer positioned between the bottom contact layer and the substrate, between the bottom contact layer and the plurality of bit line structures, and between the bottom contact layer and the plurality of partition layers; and a top contact layer positioned on the bottom contact layer and the liner layer. A top surface of the bottom contact layer and a top surface of the liner layer are substantially coplanar. The liner layer includes doped polycrystalline silicon, doped polycrystalline germanium, or doped polycrystalline silicon germanium. The bottom contact layer includes tungsten, titanium, or titanium nitride.

Another aspect of the present disclosure provides a semiconductor device including a substrate; two bit line structures may be formed on the substrate, extending along a first direction, and separated from each other; two partition layers positioned on the substrate, extending along a second direction perpendicular to the first direction, separated from each other along the first direction, and simultaneously contacting the two bit line structures; and a cell contact structure including a bottom contact layer positioned on the substrate and enclosed by the two bit line structures and the two partition layers, a liner layer positioned between the substrate and the bottom contact layer, between the two bit line structures and the bottom contact layer, and between the two partition layer and the bottom contact layer, and a top contact layer positioned on the liner layer and the bottom contact layer. A top surface of the liner layer and a top surface of the bottom contact layer are substantially coplanar. The liner layer includes doped polycrystalline silicon, doped polycrystalline germanium, or doped polycrystalline silicon germanium. The bottom contact layer includes tungsten, titanium, or titanium nitride.

Another aspect of the present disclosure provides a method for fabricating a semiconductor device including providing a substrate; forming two bit line structures on the substrate, extending along a first direction, and separated from each other; forming a plurality of spacer structures on sides of the two bit line structures; forming two partition layers on the substrate, extending along a second direction perpendicular to the first direction, separated from each other, and resulting in a contact opening in conjunction with the plurality of spacer structures; conformally forming a liner layer in the contact opening and within the contact opening; forming a bottom contact layer on the liner layer and within the contact opening; and forming a top contact layer on the liner layer, on the bottom contact layer, and within the contact opening. The liner layer includes doped polycrystalline silicon, doped polycrystalline germanium, or doped polycrystalline silicon germanium. The bottom contact layer includes tungsten, titanium, or titanium nitride. The liner layer, the bottom contact layer, and the top contact layer together configure a cell contact structure.

Due to the design of the semiconductor device of the present disclosure, the junction leakage of the cell contact structure may be reduced by employing the liner layer formed of doped polycrystalline silicon, doped polycrystalline germanium, or doped polycrystalline silicon germanium. In addition, the sheet resistance of the cell contact structure may be reduced by employing the bottom contact layer and the top contact layer formed of titanium nitride, tungsten, or titanium. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIG. 2 illustrates, in a schematic top-view diagram, an intermediate semiconductor device in accordance with one embodiment of the present disclosure;

FIG. 3 is a schematic cross-sectional view diagram taken along lines A-A' and B-B' in FIG. 2;

FIG. 4 illustrates, in a schematic top-view diagram, an intermediate semiconductor device in accordance with one embodiment of the present disclosure;

FIG. 5 is a schematic cross-sectional view diagram taken along lines A-A' and B-B' in FIG. 4;

FIG. 6 illustrates, in a schematic top-view diagram, an intermediate semiconductor device in accordance with one embodiment of the present disclosure;

FIG. 7 is a schematic cross-sectional view diagram taken along lines A-A' and B-B' in FIG. 6;

FIG. 8 illustrates, in a schematic top-view diagram, an intermediate semiconductor device in accordance with one embodiment of the present disclosure;

FIG. 9 is a schematic cross-sectional view diagram taken along lines A-A' and B-B' in FIG. 8;

FIG. 10 illustrates, in a schematic top-view diagram, an intermediate semiconductor device in accordance with one embodiment of the present disclosure;

FIG. 12 illustrates, in a schematic top-view diagram, an intermediate semiconductor device in accordance with one embodiment of the present disclosure;

FIG. 14 illustrates, in a schematic top-view diagram, an intermediate semiconductor device in accordance with one embodiment of the present disclosure;

FIG. 17 illustrates, in a schematic top-view diagram, an intermediate semiconductor device in accordance with one embodiment of the present disclosure;

FIG. 19 illustrates, in a schematic top-view diagram, an intermediate semiconductor device in accordance with one embodiment of the present disclosure;

FIG. 24 illustrates, in a schematic top-view diagram, an intermediate semiconductor device in accordance with one embodiment of the present disclosure;

FIG. 27 illustrates, in a schematic top-view diagram, an intermediate semiconductor device in accordance with one embodiment of the present disclosure;

DETAILED DESCRIPTION

Figure 11:
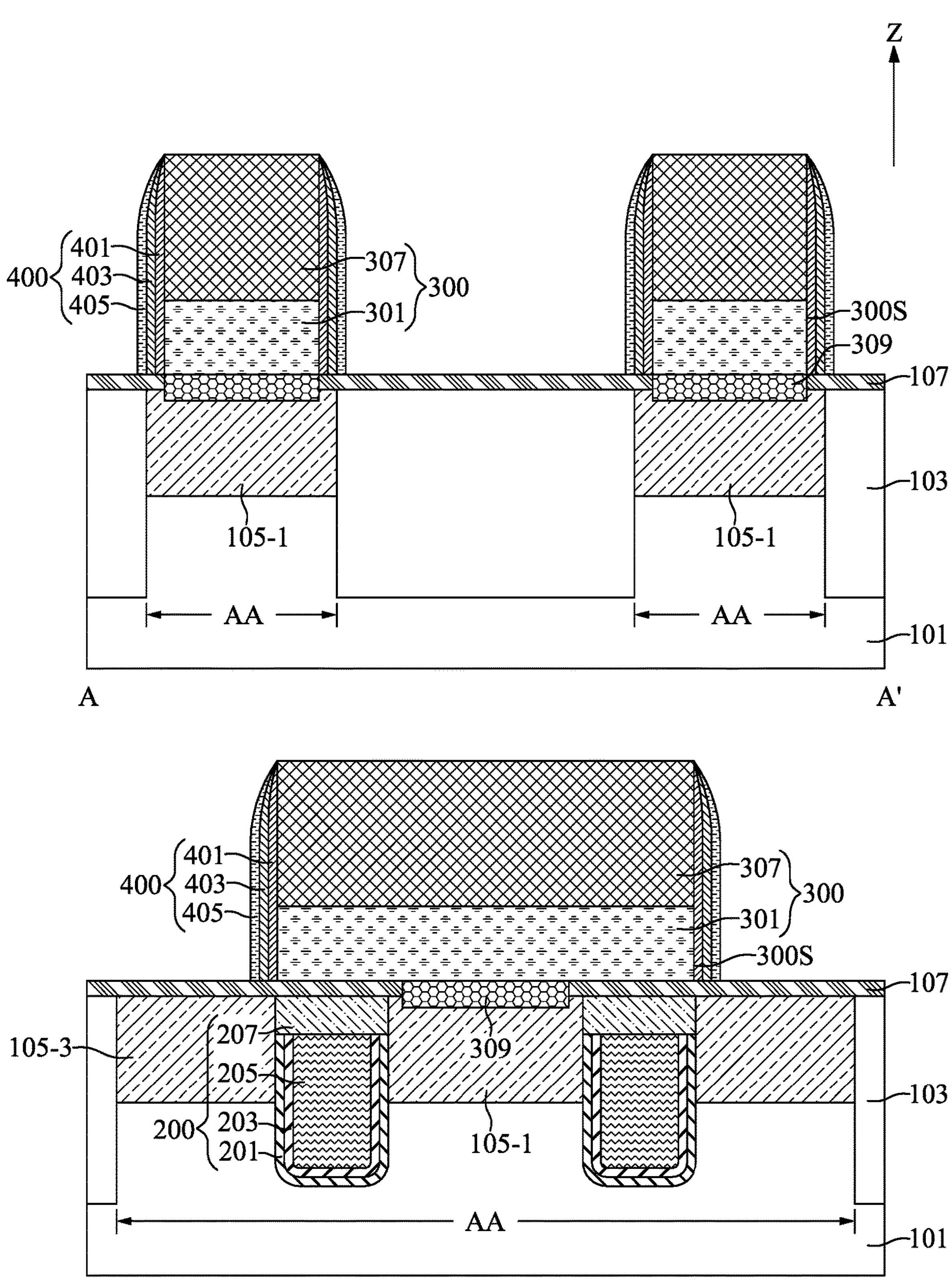
FIG. 11 is a schematic cross-sectional view diagram taken along lines A-A' and B-B' in FIG. 10.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as “same,” “equal,” “planar,” or “coplanar,” as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term “substantially” may be used herein to reflect this meaning. For example, items described as “substantially the same,” “substantially equal,” or “substantially planar,” may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' in FIG. 2. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4.

With reference to FIGS. 1 to 5, at step S11, a substrate 101 may be provided, an isolation layer 103 may be formed in the substrate 101 to define a plurality of active areas AA, and a plurality of word line structures 200 may be formed in the substrate 101 and intersecting with the plurality of active areas AA.

With reference to FIGS. 2 and 3, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, the isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials. The isolation layer 103 may define the plurality of active areas AA in the substrate 101.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

It should be noted that each of the plurality of active areas AA may comprise a portion of the substrate 101 and a space above the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the first area 10 means that the element is disposed above the top surface of the portion of the substrate 101.

With reference to FIGS. 2 and 3, a plurality of impurity regions 105 may be formed in the plurality of active areas AA, respectively and correspondingly. In some embodiments, the plurality of impurity regions 105 may be formed by an implantation process. That is, the plurality of impurity regions 105 may be turned from portions of the plurality of active areas AA. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorus. In some embodiments, the dopant concentration of the plurality of impurity regions 105 may be between about 1E19 atoms/cm^3 and about 1E21 atoms/cm^3. After the implantation process, the plurality of impurity regions 105 may have an electrical type such as n-type or p-type.

With reference to FIGS. 4 and 5, a plurality of word line trenches TR may be formed in the substrate 101 to define the position of the plurality of word line structures 200. The plurality of word line trenches TR may be formed by a photolithography process and a following etching process. In some embodiments, the plurality of word line trenches TR may have a line-shaped cross-sectional profile, extend along the direction X, and travers (or intersect) with the plurality of impurity regions 105 in a top-view perspective. For example, each impurity region 105 may be intersected with two word line trenches TR. The plurality of word line trenches TR may divide each of the plurality of impurity regions 105 into a plurality of common source regions 105-1 and a plurality of drain regions 105-3. For one impurity region 105, one common source region 105-1 may be formed between the two word line trenches TR and two drain regions 105-3 may be respectively and correspondingly formed between the isolation layer 103 and the two word line trenches TR.

With reference to FIGS. 4 and 5, the plurality of word line structures 200 (e.g., two word line structures 200) may be formed in the plurality of word line trenches TR (e.g., two word line trenches TR), respectively and correspondingly. For brevity, clarity, and convenience of description, only one word line structure 200 is described. The word line structure 200 may include a word line dielectric layer 201, a word line barrier layer 203, a word line conductive layer 205, and a word line capping layer 207.

With reference to FIGS. 4 and 5, the word line dielectric layer 201 may be conformally formed on the inner surface of the word line trench TR. The word line dielectric layer 201 may have a U-shaped cross-sectional profile. In other words, the word line dielectric layer 201 may be inwardly formed in the active area AA. In some embodiments, the word line dielectric layer 201 may be formed by a thermal oxidation process. For example, the word line dielectric layer 201 may be formed by oxidizing the inner surface of the word line trench TR. In some embodiments, the word line dielectric layer 201 may be formed by a deposition process such as a chemical vapor deposition or an atomic layer deposition. The word line dielectric layer 201 may include a high-k material, an oxide, a nitride, an oxynitride or combinations thereof. In some embodiments, after a liner polysilicon layer (not shown for clarity) is deposited, the word line dielectric layer 201 may be formed by radical-oxidizing the liner polysilicon layer. In some embodiments, after a liner silicon nitride layer (not shown for clarity) is formed, the word line dielectric layer 201 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

With reference to FIGS. 4 and 5, the word line barrier layer 203 may be conformally formed on the word line dielectric layer 201 and within the word line trench TR. In some embodiments, the word line barrier layer 203 may be formed of, for example, titanium nitride, titanium, or a combination thereof. In some embodiments, the word line barrier layer 203 may be formed of, for example, titanium nitride. In some embodiments, the word line barrier layer 203 may be formed by, for example, atomic layer deposition, physical vapor deposition, chemical vapor deposition, or other applicable deposition processes.

With reference to FIGS. 4 and 5, the word line conductive layer 205 may be formed on the word line barrier layer 203 and within the word line trench TR. In some embodiments, in order to form the word line conductive layer 205, a conductive layer (not shown for clarity) may be formed to fill the word line trench TR, and a recessing process may be subsequently performed. The recessing process may be performed as an etching back process or sequentially performed as the planarization process and an etching back process. The word line conductive layer 205 may have a recessed shape that partially fills the word line trench TR. That is, the top surface of the word line conductive layer 205 may be lower than the top surface of the substrate 101.

In some embodiments, the word line conductive layer 205 may include a metal, a metal nitride, or a combination thereof. For example, the word line conductive layer 205 may be formed of titanium nitride, tungsten, or a titanium nitride/tungsten. After the titanium nitride is conformally formed, the titanium nitride/tungsten may have a structure where the word line trench TR is partially filled using tungsten. The titanium nitride or the tungsten may be solely used for the word line conductive layer 205. In some embodiments, the word line conductive layer 205 may be formed of, for example, a conductive material such as doped polycrystalline silicon, doped polycrystalline silicon germanium, or a combination thereof. In some embodiments, the word line conductive layer 205 may be formed of, for example, tungsten, aluminum, titanium, copper, the like, or a combination thereof.

With reference to FIGS. 4 and 5, a dielectric material (not shown) may be deposited by, for example chemical vapor deposition, to completely fill the word line trenches TR and covering the top surface of the substrate 101. A planarization process, such as chemical mechanical polishing, may be performed to provide a substantially flat surface for subsequent processing steps and form the word line capping layer 207. In some embodiments, the word line capping layer 207 may be formed of, for example, silicon nitride, or other applicable dielectric material.

FIG. 6 illustrates, in a schematic top-view diagram, an intermediate semiconductor device in accordance with one embodiment of the present disclosure. FIG. 7 is a schematic cross-sectional view diagram taken along lines A-A' and B-B' in FIG. 6. FIG. 8 illustrates, in a schematic top-view diagram, an intermediate semiconductor device in accordance with one embodiment of the present disclosure. FIG. 9 is a schematic cross-sectional view diagram taken along lines A-A' and B-B' in FIG. 8. FIG. 10 illustrates, in a schematic top-view diagram, an intermediate semiconductor device in accordance with one embodiment of the present disclosure. FIG. 11 is a schematic cross-sectional view diagram taken along lines A-A' and B-B' in FIG. 10. It should be noted that some elements are omitted in top-view diagrams for clarity.

With reference to FIG. 1 and FIGS. 6 to 11, at step S13, a plurality of bit line structures 300 may be formed on the substrate 101, and a plurality of spacer structures 400 may be formed on sides 300S of the plurality of bit line structures 300.

With reference to FIGS. 6 and 7, the bottom dielectric layer 107 may be formed on the substrate 101. In some embodiments, the bottom dielectric layer 107 may be formed of a material having etching selectivity to the substrate 101 and the isolation layer 103. In some embodiments, the bottom dielectric layer 107 may be formed of, for example, silicon nitride, boron nitride, silicon boron nitride, phosphorus boron nitride, boron carbon silicon nitride, or a combination thereof. In some embodiments, the bottom dielectric layer 107 may be formed of, for example, silicon nitride. In some embodiments, the bottom dielectric layer 107 may be formed by, for example, chemical vapor deposition, plasma-enhanced chemical vapor deposition, or other applicable deposition processes.

With reference to FIGS. 6 and 7, a plurality of bit line contacts 309 may be formed penetrating the bottom dielectric layer 107 and extending to the plurality of common source regions 105-1, respectively and correspondingly. In some embodiments, the plurality of bit line contacts 309 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the plurality of bit line contacts 309 may have a square-shaped cross-sectional profile in a top-view perspective but is not limited to that shape. In some embodiments, the plurality of bit line contacts 309 may have a rectangle-shaped, a circle-shaped, or other applicable shaped cross-sectional profile in a top-view perspective.

With reference to FIGS. 8 and 9, the plurality of bit line structures 300 may be formed on the bottom dielectric layer 107 and electrically connected to the plurality of bit line contacts 309, respectively and correspondingly. In a top-view perspective, the plurality of bit line structures 300 may extend along the direction Y and be separated from each other. In other words, the plurality of bit line structure 300 may intersect with the plurality of word line structures 200 in a top-view perspective. For brevity, clarity, and convenience of description, only one bit line structure 300 is described. In some embodiments, the bit line structure 300 may include a bit line top conductive layer 301 and a bit line capping layer 307.

The bit line top conductive layer 301 may be formed on the bit line contact 309 and electrically connected to the bit line contact 309. In some embodiments, the bit line top conductive layer 301 may be formed of, for example, titanium nitride, tungsten, titanium, nickel, platinum, tantalum, cobalt, silver, copper, aluminum, other applicable conductive material, or a combination thereof. The bit line capping layer 307 may be formed on the bit line top conductive layer 301. In some embodiments, the bit line capping layer 307 may be formed of, for example, silicon nitride or other applicable insulating materials.

With reference to FIGS. 10 and 11, the plurality of spacer structures 400 may be formed on the sides 300S of the plurality of bit line structures 300. In other words, the plurality of spacer structures 400 may extend along the direction Y in a top-view perspective. For brevity, clarity, and convenience of description, only one spacer structure 400 is described. In some embodiments, the spacer structure 400 may include a bit line inner spacer 401, a bit line middle spacer 403, and a bit line outer spacer 405.

The bit line inner spacer 401 may be formed on the side 300S of the bit line structure 300. In some embodiments, the bit line inner spacer 401 may be formed of the same material as the bit line capping layer 307. In some embodiments, the bit line inner spacer 401 may be formed of, for example, silicon nitride or other applicable insulating material. In some embodiments, the bit line inner spacer 401 may be formed by conformally depositing a layer of insulating material (not shown) over the bottom dielectric layer 107 and a subsequent anisotropic etching process.

The bit line middle spacer 403 may be conformally formed on the bit line inner spacer 401. In some embodiments, the bit line middle spacer 403 may be formed of, for example, silicon oxide or other applicable insulating oxides. In some embodiments, the bit line middle spacer 403 may be formed by conformally depositing a layer of insulating oxide (not shown) over the bottom dielectric layer 107 and a subsequent anisotropic etching process.

The bit line outer spacer 405 may be conformally formed on the bit line middle spacer 403. In some embodiments, the bit line outer spacer 405 may be formed of the same material as the bit line inner spacer 401 or the bit line capping layer 307. In some embodiments, the bit line outer spacer 405 may be formed of, for example, silicon nitride or other applicable insulating material. In some embodiments, the bit line outer spacer 405 may be formed by conformally depositing a layer of insulating material (not shown) over the bottom dielectric layer 107 and a subsequent anisotropic etching process.

In some embodiments, the bit line inner spacer 401 may be optional. That is, the bit line middle spacer 403 may be directly formed on the side 300S of the bit line structure 300.

Figure 13:
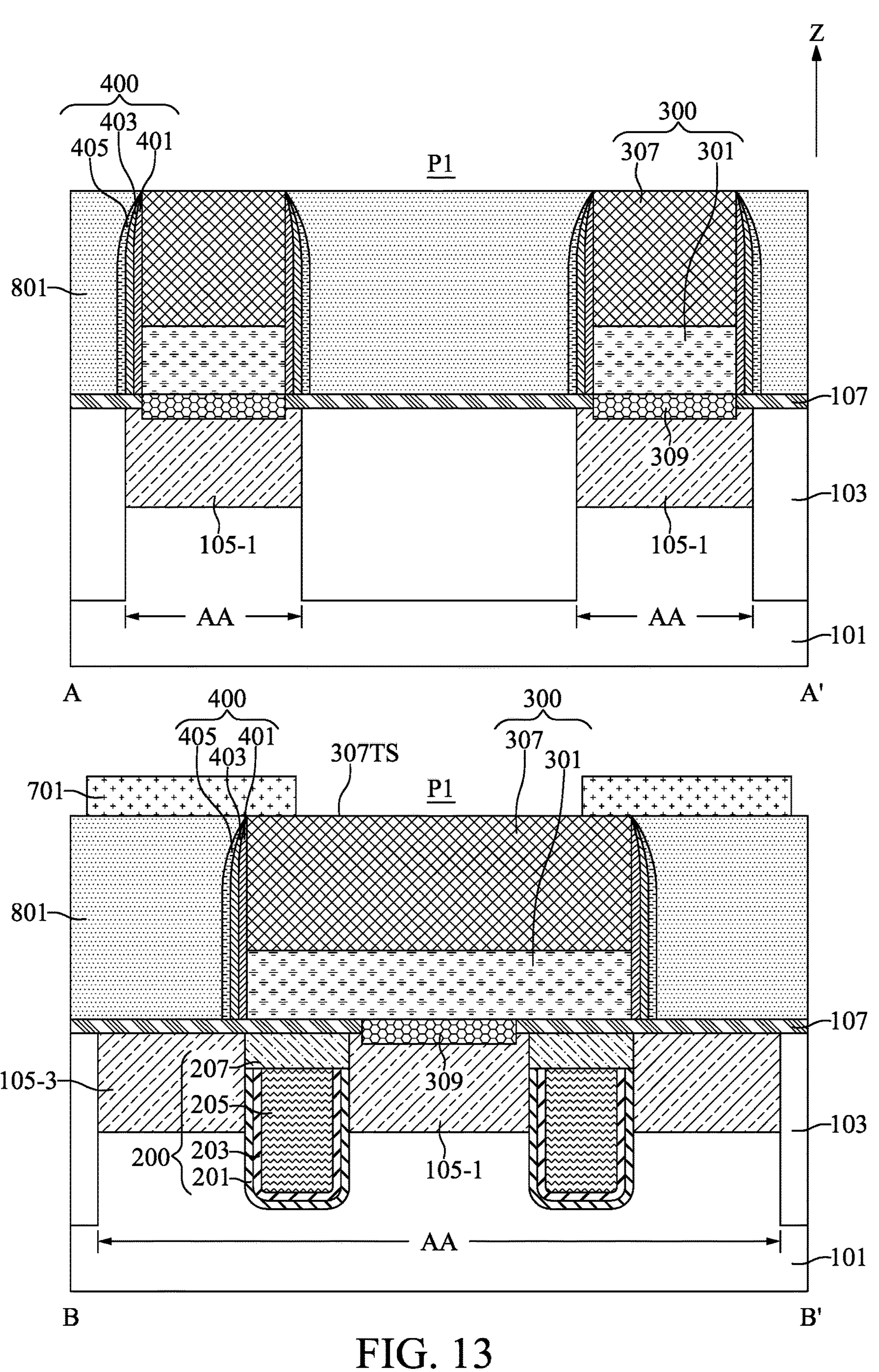
FIG. 13 is a schematic cross-sectional view diagram taken along lines A-A' and B-B' in FIG. 12.
Figure 15:
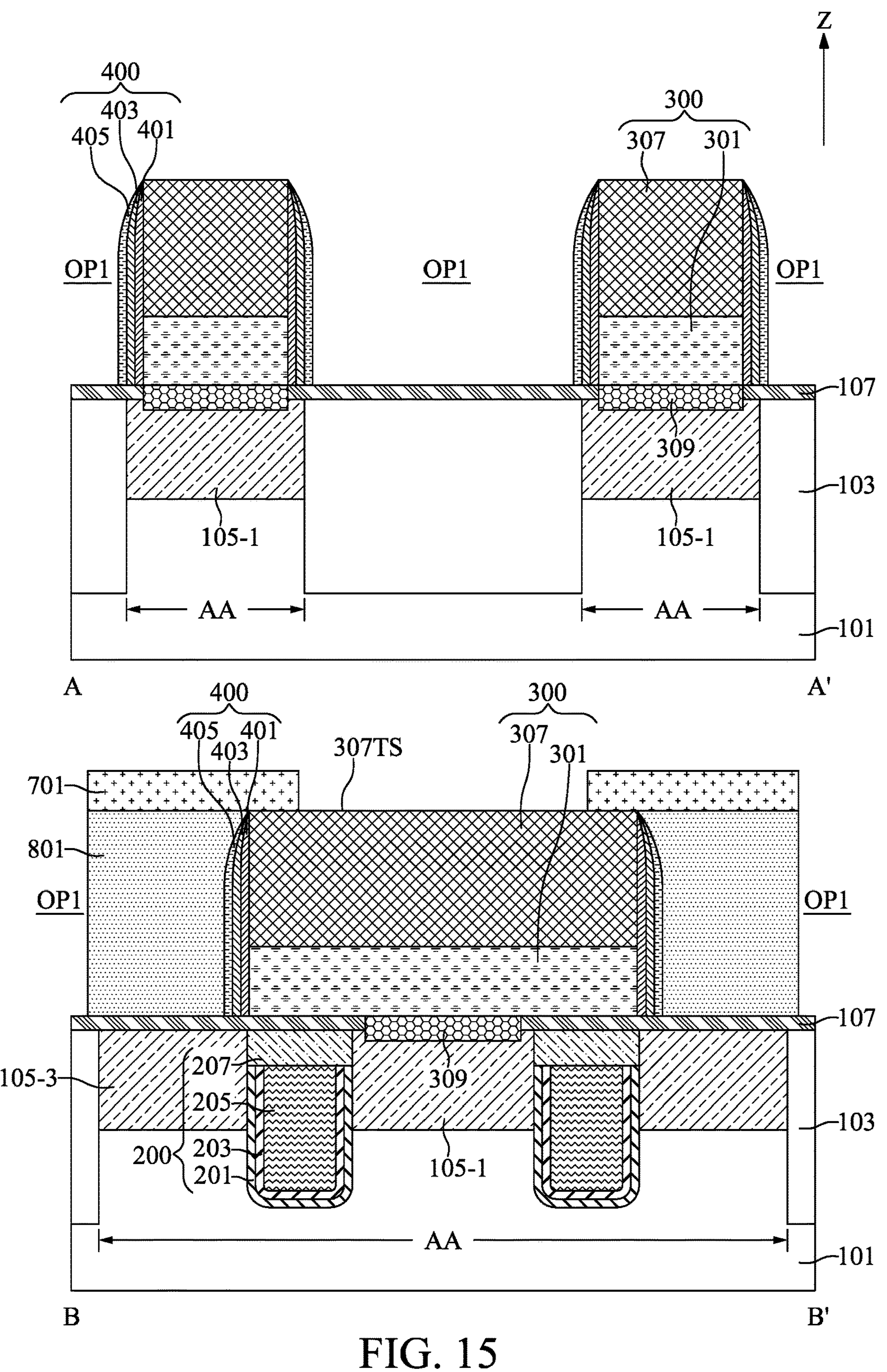
FIGS. 15 and 16 are schematic cross-sectional view diagrams taken along lines A-A' and B-B' in FIG. 14 illustrating part of a flow for fabricating the semiconductor device in accordance with one embodiment of the present disclosure.
Figure 16:
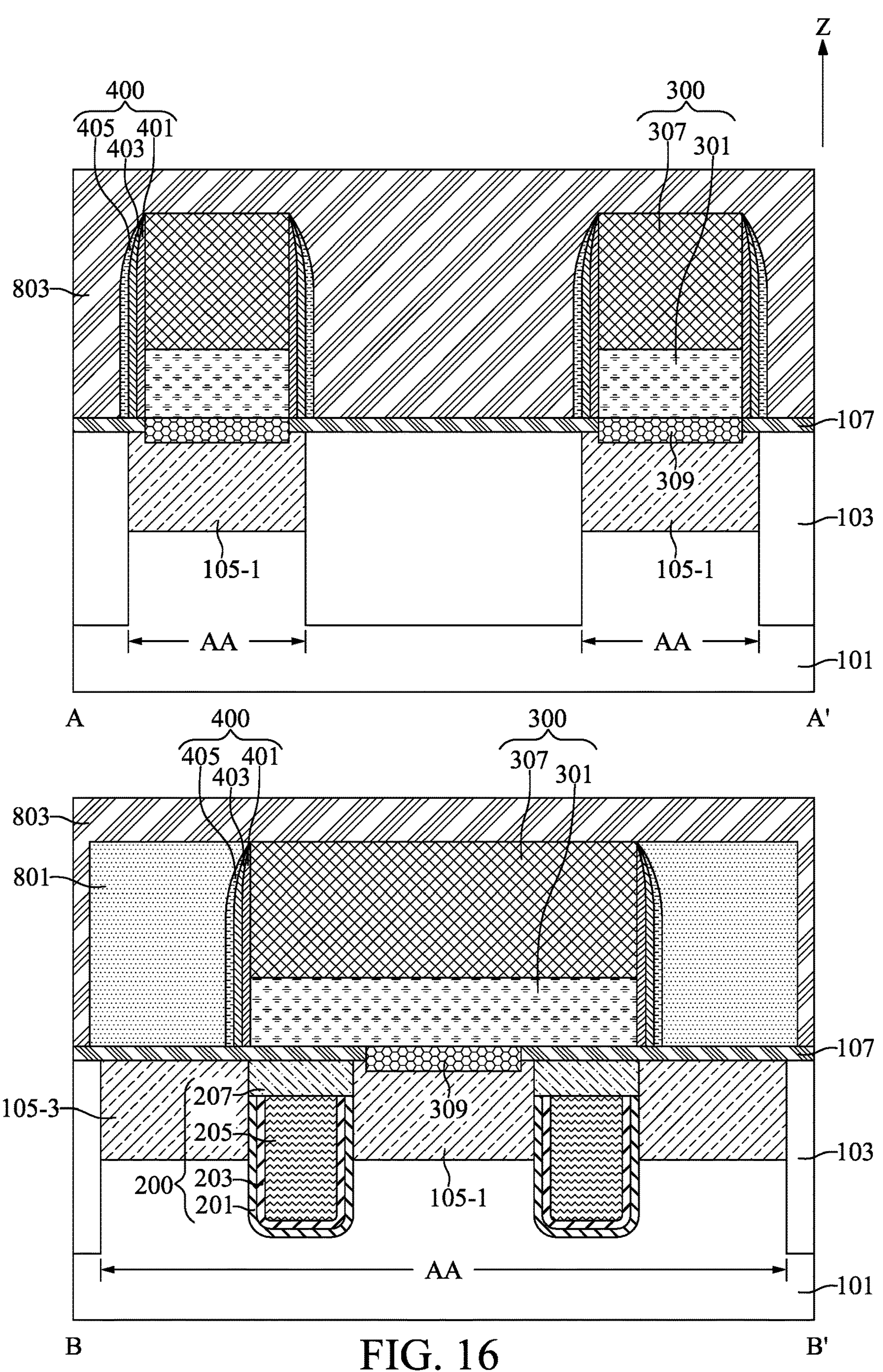
Figure 18:
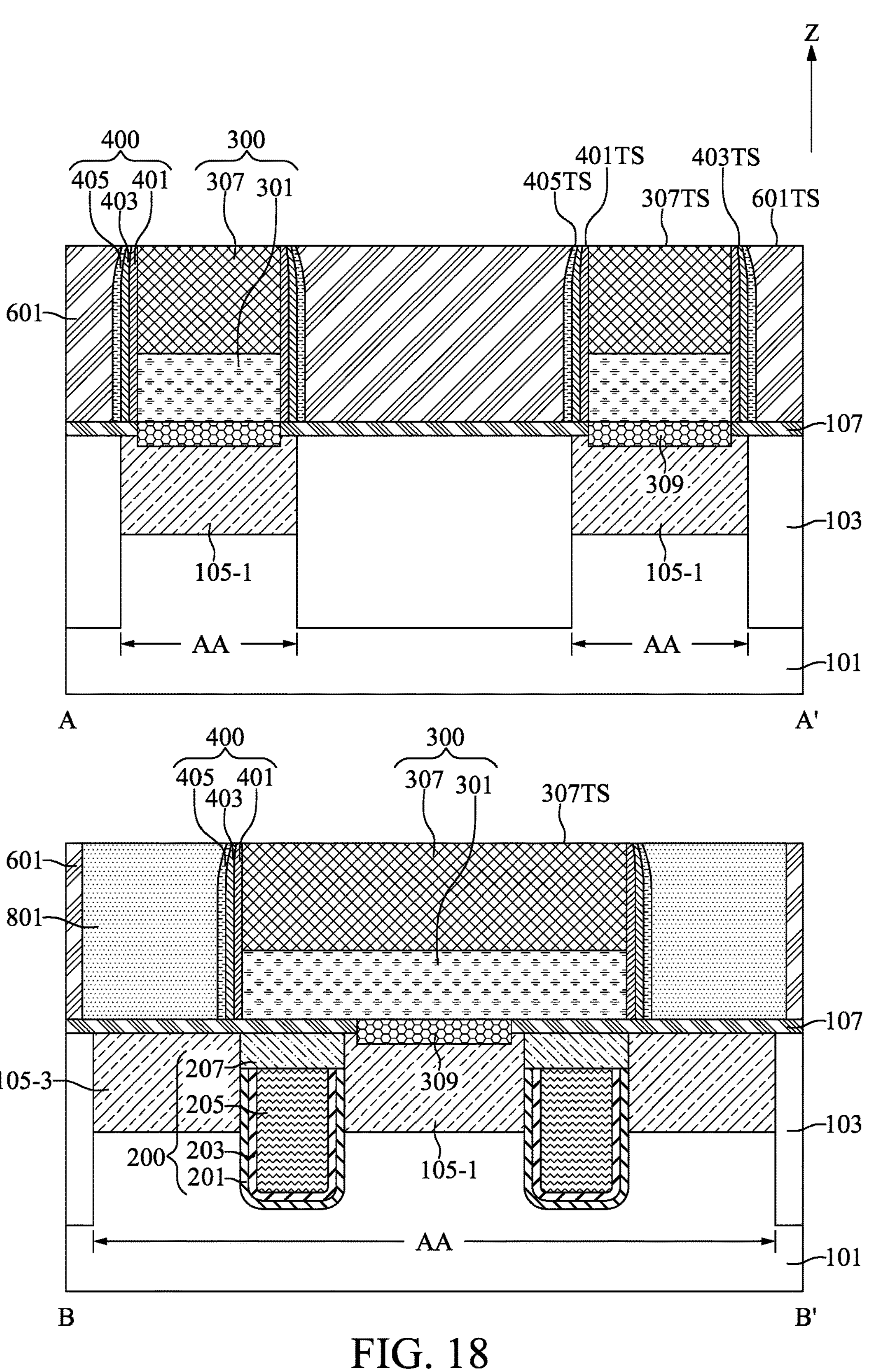
FIG. 18 is a schematic cross-sectional view diagram taken along lines A-A' and B-B' in FIG. 17.

FIG. 12 illustrates, in a schematic top-view diagram, an intermediate semiconductor device in accordance with one embodiment of the present disclosure. FIG. 13 is a schematic cross-sectional view diagram taken along lines A-A' and B-B' in FIG. 12. FIG. 14 illustrates, in a schematic top-view diagram, an intermediate semiconductor device in accordance with one embodiment of the present disclosure. FIGS. 15 and 16 are schematic cross-sectional view diagrams taken along lines A-A' and B-B' in FIG. 14 illustrating part of a flow for fabricating the semiconductor device 1A in accordance with one embodiment of the present disclosure. FIG. 17 illustrates, in a schematic top-view diagram, an intermediate semiconductor device in accordance with one embodiment of the present disclosure. FIG. 18 is a schematic cross-sectional view diagram taken along lines A-A' and B-B' in FIG. 17.

With reference to FIG. 1 and FIGS. 12 to 18, at step S15, a sacrificial layer 801 may be formed to cover the plurality of bit line structures 300 and the plurality of spacer structures 400, a first mask layer 701 including a line pattern P1 may be formed on the sacrificial layer 801 to partially expose the sacrificial layer 801, the plurality of bit line structures 300, and the plurality of spacer structures 400, the sacrificial layer 801 may be selectively removed to form a plurality of partition openings OP1, and a plurality of partition layers 601 may be formed in the plurality of partition openings OP1.

With reference to FIGS. 12 and 13, the sacrificial layer 801 may be formed over the bottom dielectric layer 107 to cover the plurality of bit line structures 300 and the plurality of spacer structures 400. In some embodiments, the sacrificial layer 801 may be formed of, for example, a material having etching selectivity to the bit line outer spacer 405 or the bit line capping layer 307. In some embodiments, the sacrificial layer 801 may be formed of, for example, silicon oxynitride, silicon nitride oxide, or other applicable materials. In some embodiments, the sacrificial layer 801 may be formed by, for example, chemical vapor deposition, plasma-enhanced chemical vapor deposition, or other applicable deposition processes. In some embodiments, a planarization process, such as chemical mechanical polishing, may be performed until the top surfaces 307TS of the plurality of bit line structures 300 are exposed to remove excess material and provide a substantially flat surface for subsequent processing steps.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 12 and 13, the first mask layer 701 may be formed on the sacrificial layer 801. In some embodiments, the first mask layer 701 may be a photoresist layer. In a top-view perspective, the line pattern P1 of the first mask layer 701 may include multiple rectangle-shaped spaces extending along the direction X. and arranged alternatively along the direction Y. Through these spaces, the sacrificial layer 801, the plurality of bit line structures 300, and the plurality of spacer structures 400 may be partially exposed.

With reference to FIGS. 14 and 15, the sacrificial layer 801 that is exposed through the line pattern P1 of the first mask layer 701 may be selectively removed. In some embodiments, the removal of the sacrificial layer 801 may be achieved by an anisotropic etching process such as an anisotropic dry etching process. After the removal of the sacrificial layer 801, the plurality of partition openings OP1 may be formed in the locations where the sacrificial layer 801 was exposed through the line pattern P1 of the first mask layer 701. The first mask layer 701 may be then removed subsequent to the formation of these partition openings OP1.

With reference to FIG. 16, a layer of partition material 803 may be formed over the sacrificial layer 801 to completely fill the plurality of partition openings OP1. In some embodiments, the partition material 803 may be a material having etching selectivity to the sacrificial layer 801. In some embodiments, the partition material 803 may be the same material as the bit line capping layer 307 or the bit line outer spacer 405. In some embodiments, the partition material 803 may be, for example, silicon nitride or other applicable insulating material. In some embodiments, the layer of partition material 803 may be formed of, for example, chemical vapor deposition or other applicable deposition processes.

With reference to FIGS. 17 and 18, a planarization process, such as chemical mechanical polishing, may be performed to remove excess material, provide a substantially flat surface for subsequent processing steps, and turn the layer of partition material 803 into a plurality of partition layers 601. In a top-view perspective, each of the plurality of partition layers 601 may have a line-shaped (or rectangle-shaped) cross-sectional profile extending along the direction X. The plurality of partition layers 601 may be arranged alternatively along the direction X, with each corresponding bit line structure 300 situated between two adjacent partition layers 601. Along the direction Y, the plurality of partition layers 601 may be arranged alternatively with the sacrificial layer 801 interposed therebetween. In a top-view perspective, the arrangement of the plurality of partition layers 601 and the plurality of bit line structures 300 may divide the sacrificial layer 801 into multiple segments.

For brevity, clarity, and convenience of description, only one partition layer 601 is described. In some embodiments, after the planarization process, the bit line inner spacer 401, the bit line middle spacer 403, and the bit line outer spacer 405 may be exposed. The top surface 601TS of the partition layer 601, the top surface 401TS of the bit line inner spacer 401, the top surface 403TS of the bit line middle spacer 403, the top surface 405TS of the bit line outer spacer 405, the top surface 307TS of the bit line capping layer 307 may be substantially coplanar.

In some embodiments, the bit line inner spacer 401 and the bit line middle spacer 403 may be covered by the bit line outer spacer 405 (not shown) after the planarization process. In that situation, the top surface 405TS of the bit line outer spacer 405, the top surface 307TS of the bit line capping layer 307 may be substantially coplanar.

Figure 25:
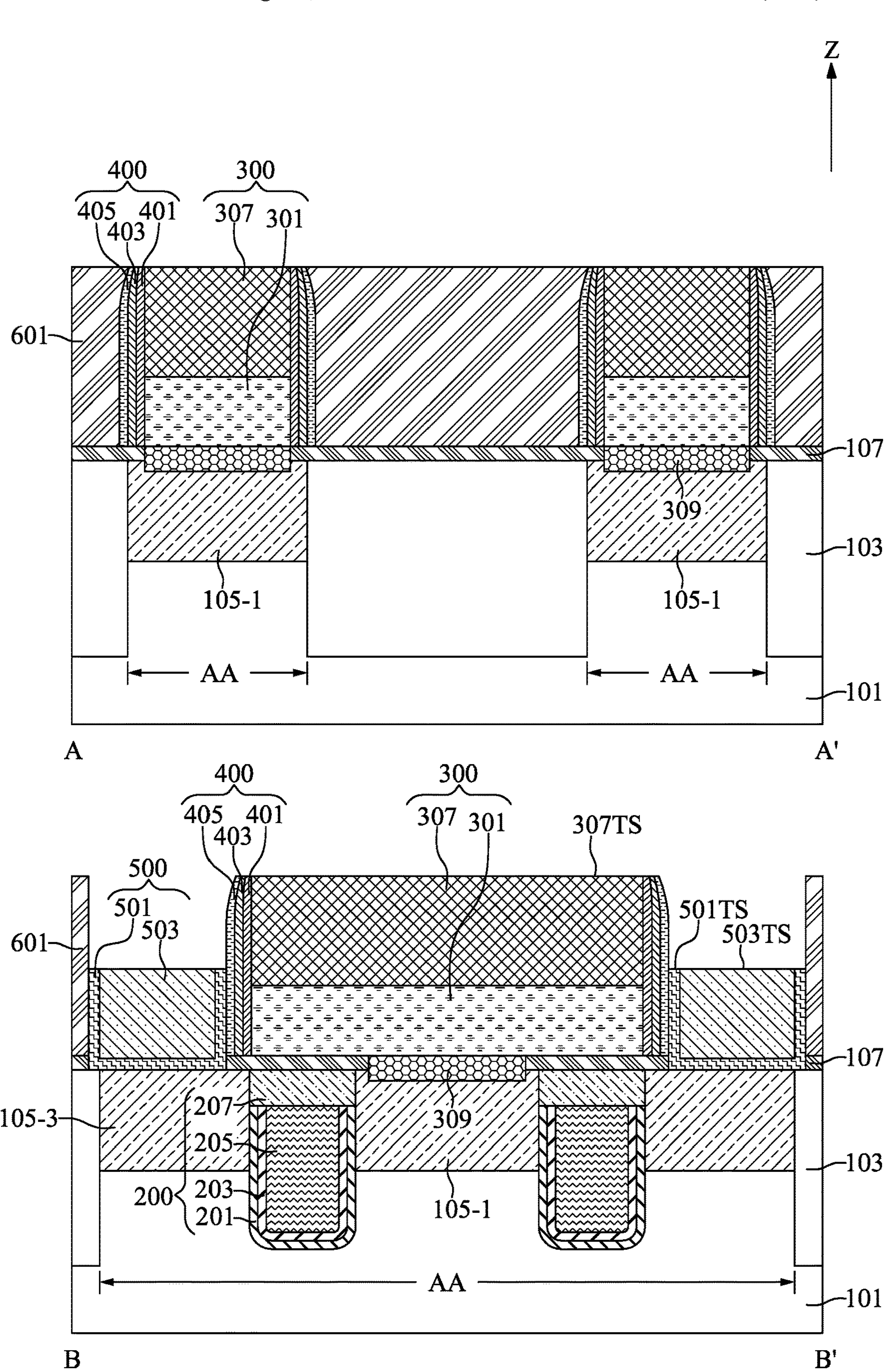
FIGS. 25 and 26 are schematic cross-sectional view diagrams taken along lines A-A' and B-B' in FIG. 24 illustrating part of the flow for fabricating the semiconductor device in accordance with one embodiment of the present disclosure.
Figure 26:
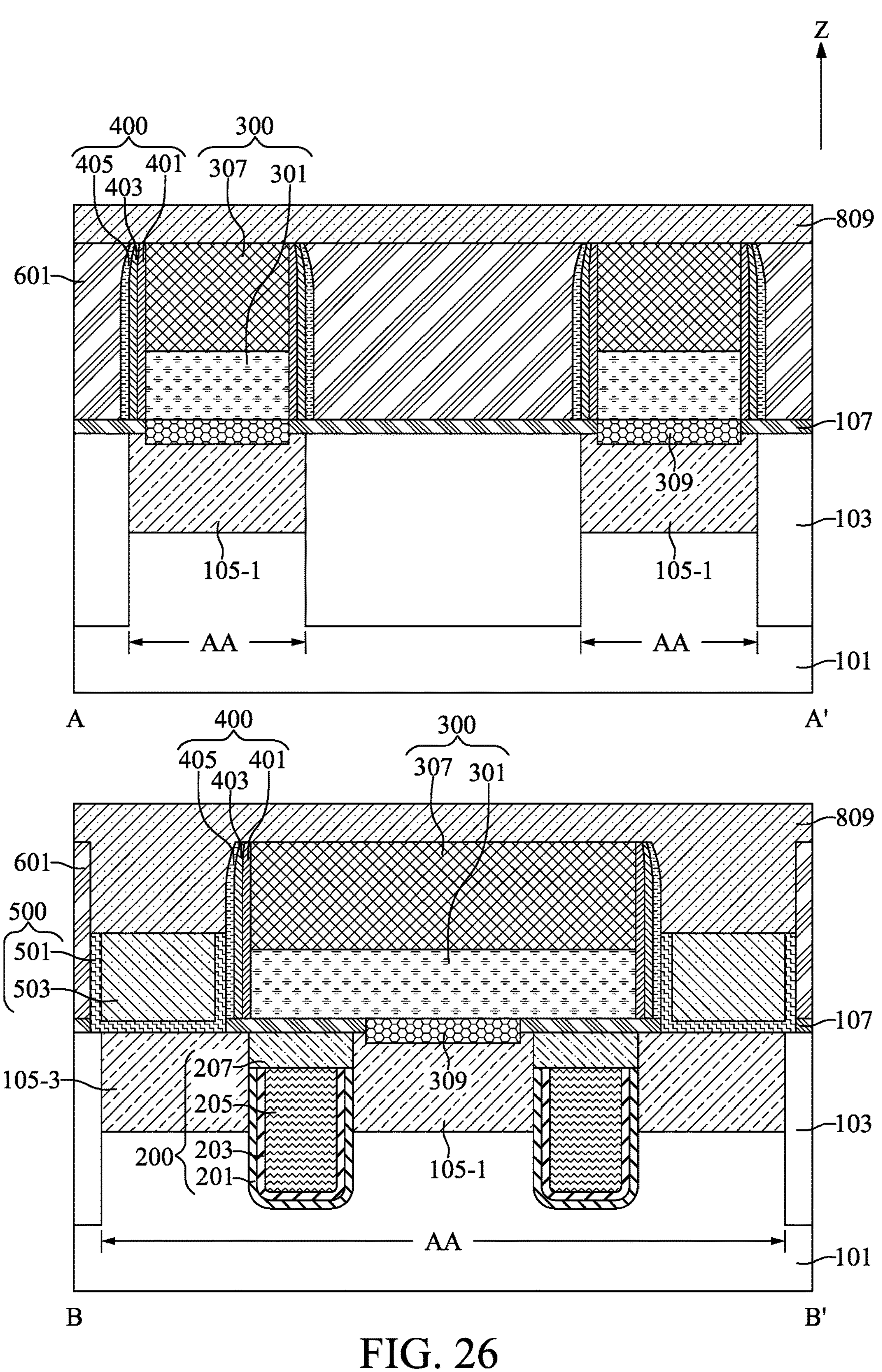
Figure 28:
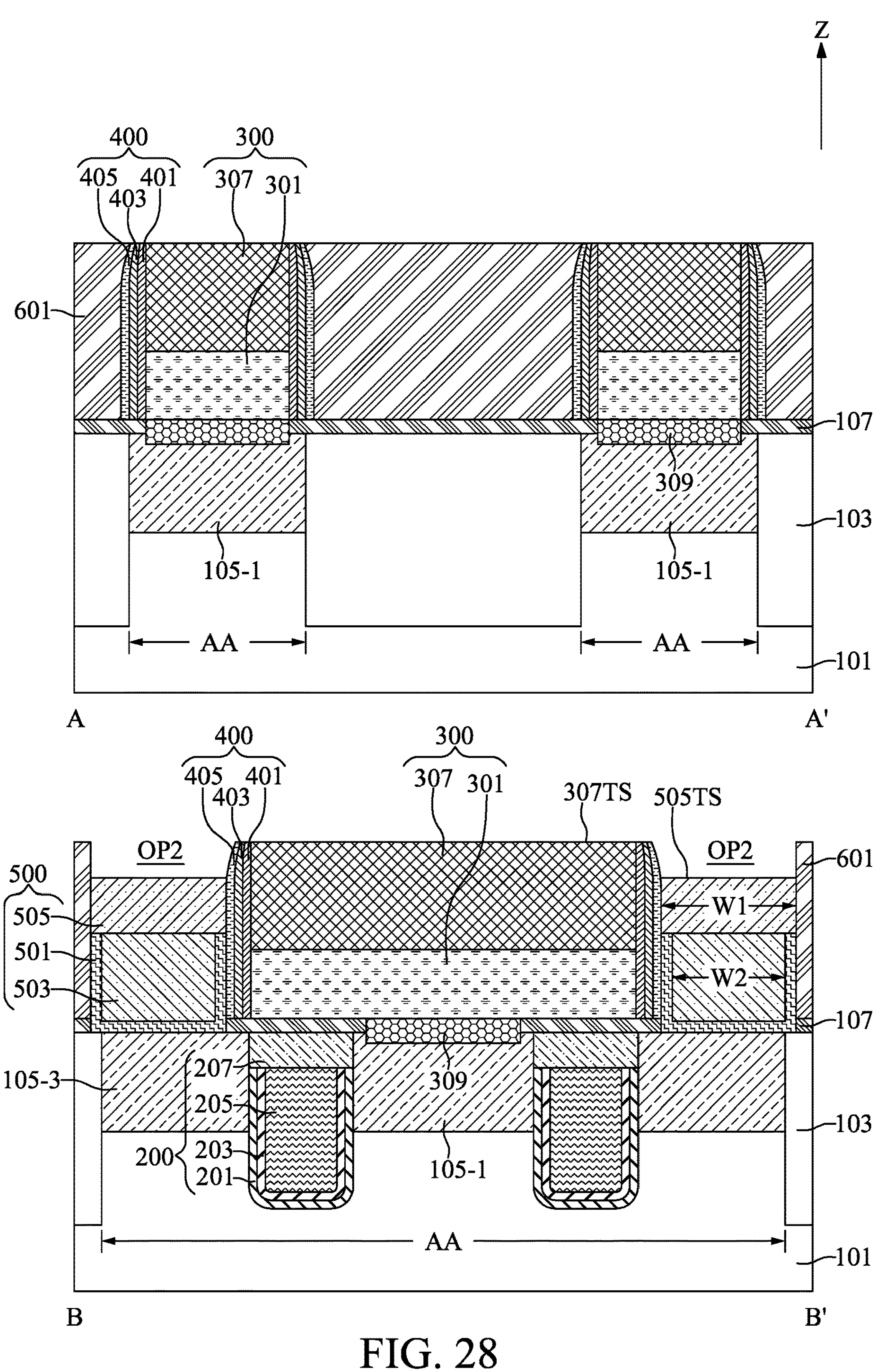
FIGS. 28 and 29 are schematic cross-sectional view diagrams taken along lines A-A' and B-B' in FIG. 27 illustrating part of the flow for fabricating the semiconductor device in accordance with one embodiment of the present disclosure.
Figure 29:
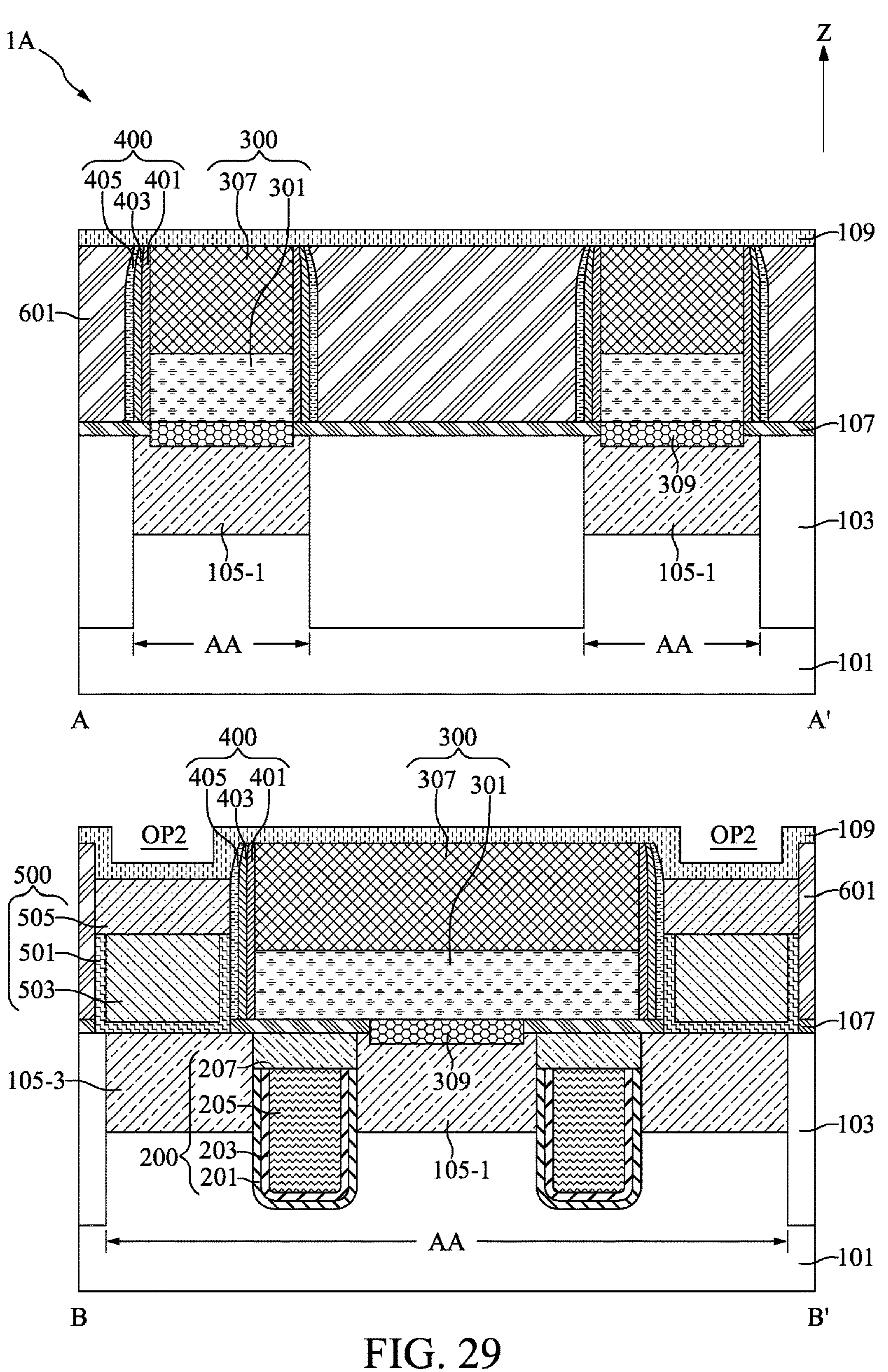

FIG. 19 illustrates, in a schematic top-view diagram, an intermediate semiconductor device in accordance with one embodiment of the present disclosure. FIGS. 20 to 23 are schematic cross-sectional view diagrams taken along lines A-A' and B-B' in FIG. 19 illustrating part of the flow for fabricating the semiconductor device 1A in accordance with one embodiment of the present disclosure. FIG. 24 illustrates, in a schematic top-view diagram, an intermediate semiconductor device in accordance with one embodiment of the present disclosure. FIGS. 25 and 26 are schematic cross-sectional view diagrams taken along lines A-A' and B-B' in FIG. 24 illustrating part of the flow for fabricating the semiconductor device 1A in accordance with one embodiment of the present disclosure. FIG. 27 illustrates, in a schematic top-view diagram, an intermediate semiconductor device in accordance with one embodiment of the present disclosure. FIGS. 28 and 29 are schematic cross-sectional view diagrams taken along lines A-A' and B-B' in FIG. 27 illustrating part of the flow for fabricating the semiconductor device 1A in accordance with one embodiment of the present disclosure.

With reference to FIG. 1 and FIGS. 19 to 29, at step S17, the sacrificial layer 801 may be selectively removed to form a plurality of contact openings OP2, a plurality of cell contact structures 500 may be formed in the plurality of contact openings OP2, and a top insulating layer 109 may be formed to cover the plurality of bit line structures 300, the plurality of spacer structures 400, and the plurality of cell contact structures 500.

Figure 20:
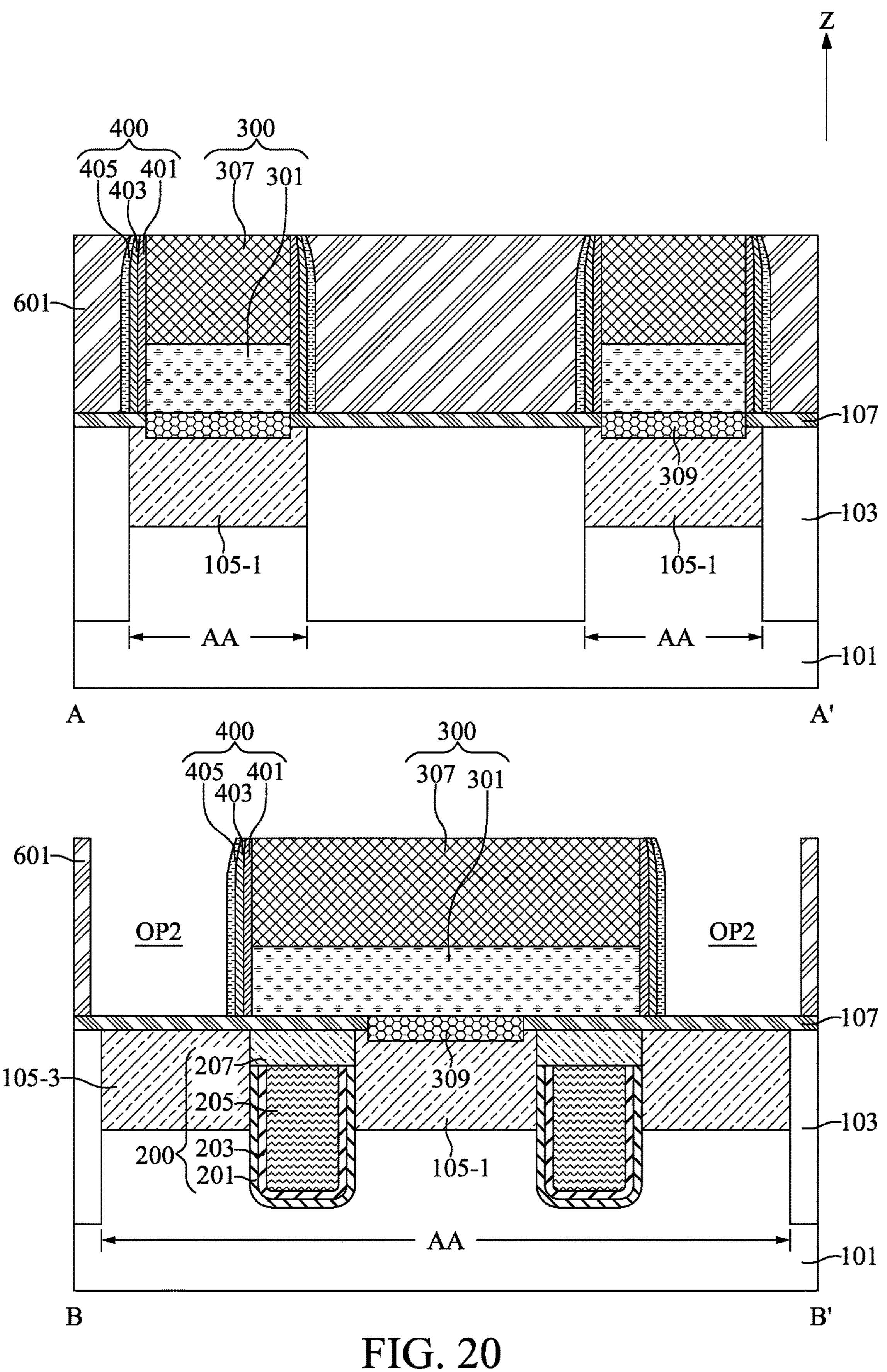
FIGS. 20 to 23 are schematic cross-sectional view diagrams taken along lines A-A' and B-B' in FIG. 19 illustrating part of the flow for fabricating the semiconductor device in accordance with one embodiment of the present disclosure.

With reference to FIGS. 19 and 20, the sacrificial layer 801 may be selectively removed by an etching process. For example, the removal of the sacrificial layer 801 may be achieved by an anisotropic etching process. After the removal of the sacrificial layer 801, the plurality of contact openings OP2 may be formed in the locations where the sacrificial layer 801 (in multiple segments form) was previously occupied. For brevity, clarity, and convenience of description, only one contact opening OP2 is described. In a cross-sectional perspective, the contact opening OP2 may be disposed on the bottom dielectric layer 107. In a top-view perspective, the contact opening OP2 may be enclosed by two adjacent partition layers 601 along the direction Y and two adjacent bit line structures 300 (or the spacer structures 400 disposing on the sides 300S of the two adjacent bit line structures 300) along the direction X.

Figure 21:
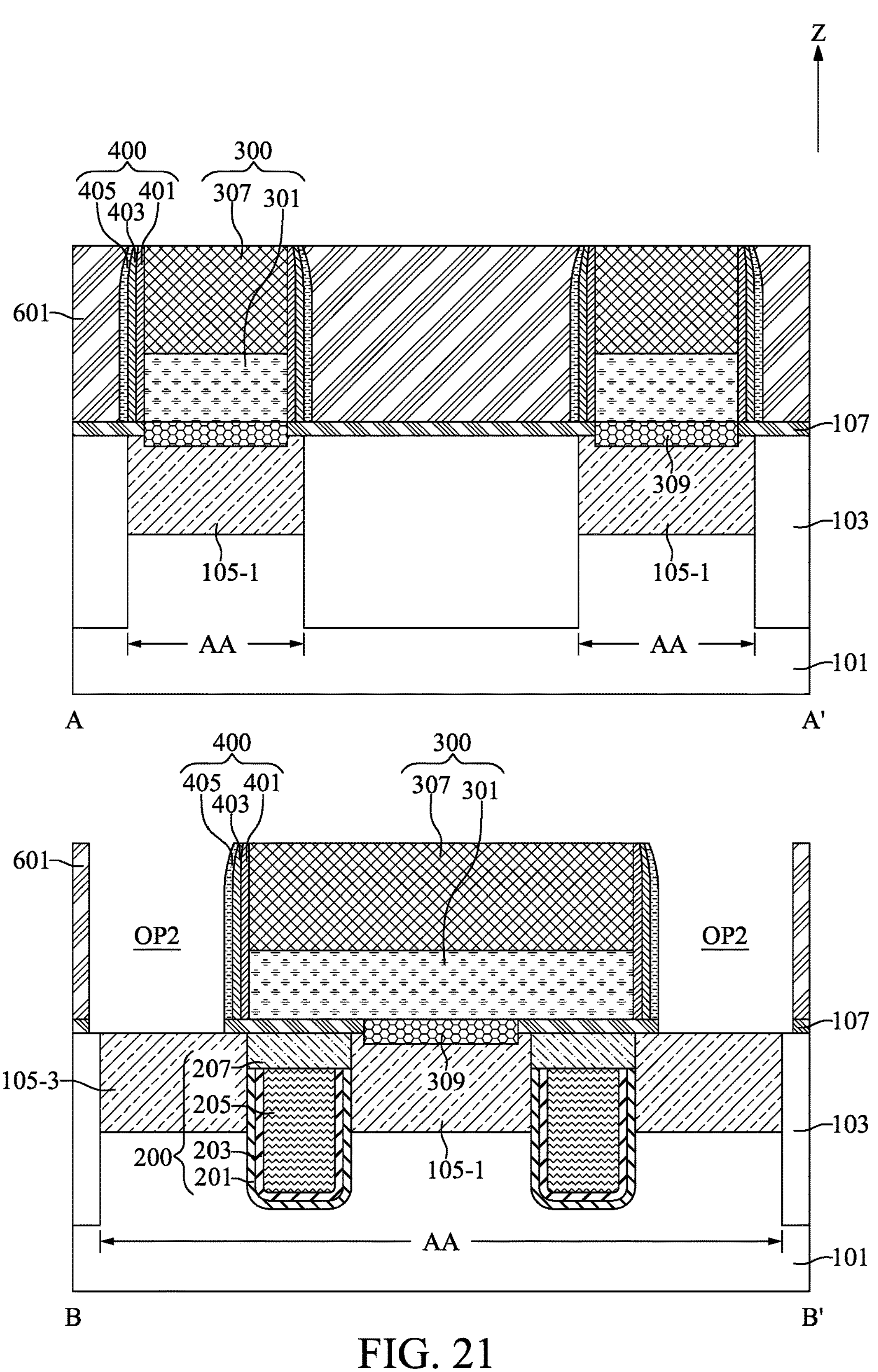

With reference to FIG. 21, a punch-through etching process may be performed to remove portions of the bottom dielectric layer 107 that exposes through the plurality of contact openings OP2. In some embodiments, the punch-through etching process may be an anisotropic dry etching process. The punch-through etching process may extend the plurality of contact openings OP2 downward to the substrate 101. After the punch-through etching process, the plurality of drain regions 105-3 may be exposed through the plurality of contact openings OP2.

Figure 22:
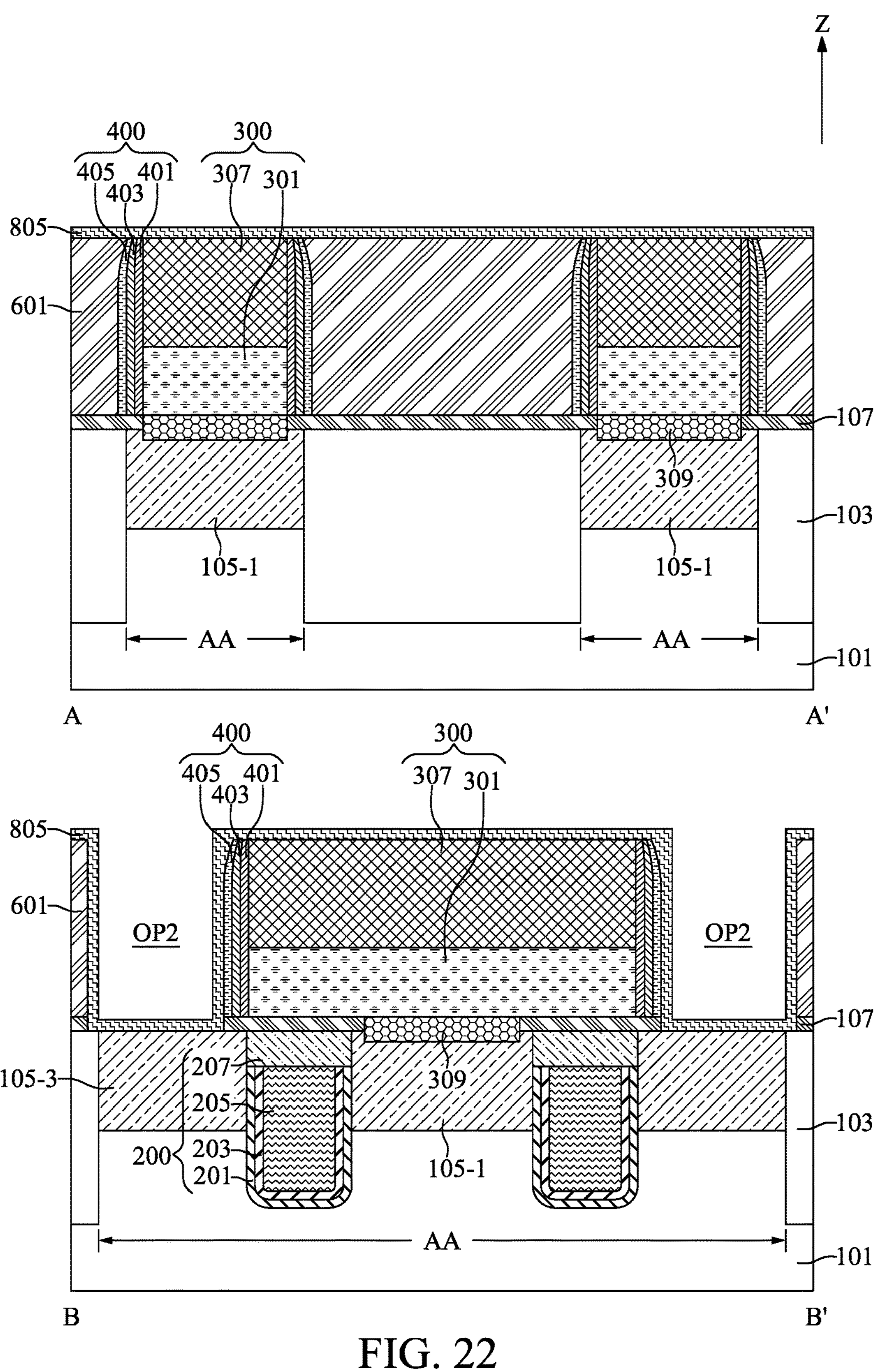

With reference to FIG. 22, a layer of liner material 805 may be conformally formed to cover the substrate 101, the plurality of bit line structures 300, the plurality of spacer structures 400, and the plurality of partition layers 601. In some embodiments, the liner material 805 may be, for example, doped polycrystalline silicon, doped polycrystalline germanium, or doped polycrystalline silicon germanium. In some embodiments, the liner material 805 may include p-type dopants or n-type dopants. In some embodiments, the layer of liner material 805 may be formed by, for example, atomic layer deposition, chemical vapor deposition, or other applicable deposition processes. By employing doped polycrystalline silicon, doped polycrystalline germanium, or doped polycrystalline silicon germanium as the liner material 805 for the cell contact structure 500, the junction leakage may be reduced. As a result, the performance of the semiconductor device 1A may be improved.

Figure 23:
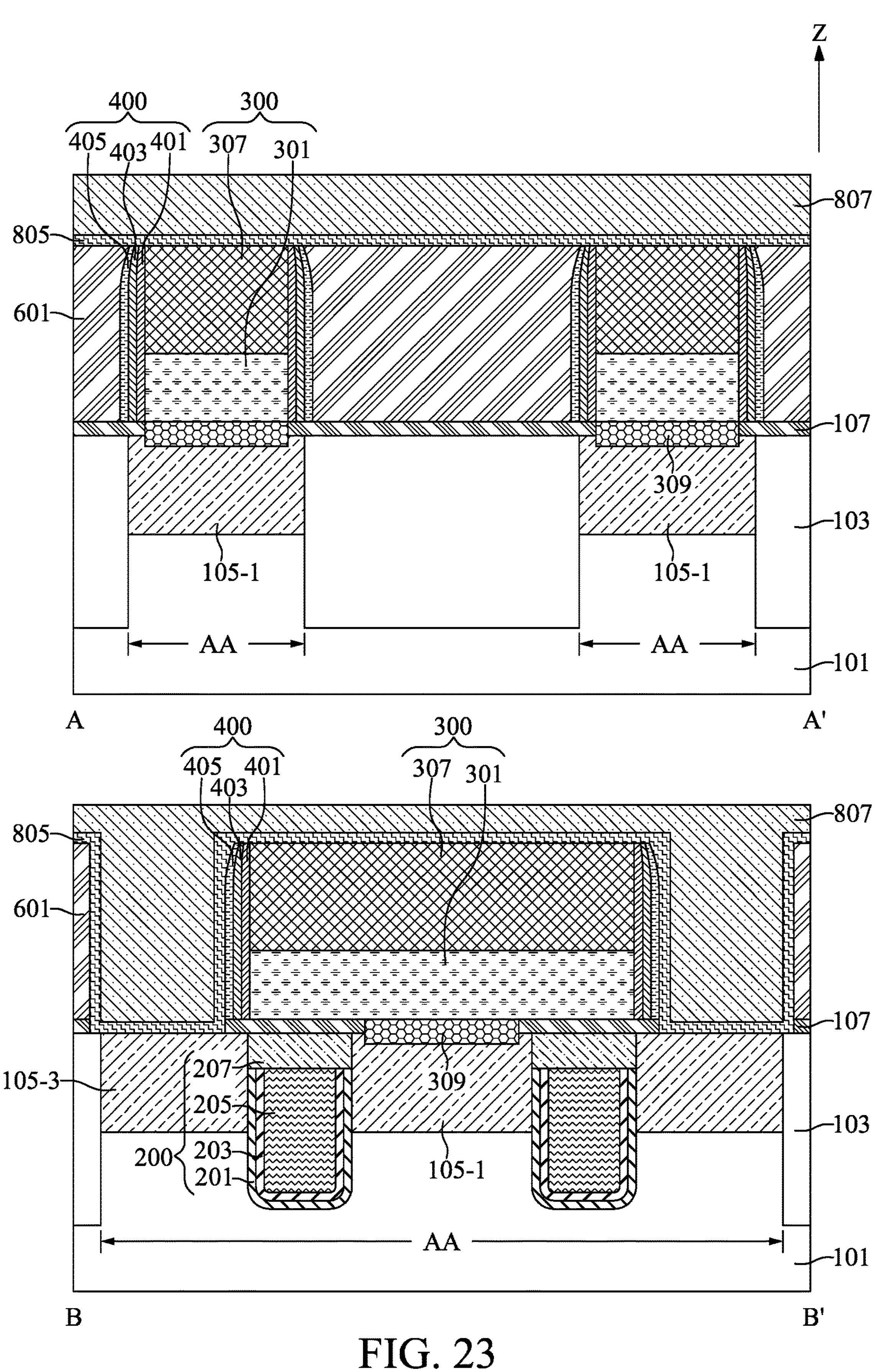

With reference to FIG. 23, a layer of first conductive material 807 may be formed on the layer of liner material 805 and may completely fill the plurality of contact openings OP2. In some embodiments, the first conductive material 807 may be a material having good electrical conductivity (or a material having electrical conductivity better than polycrystalline silicon, polycrystalline germanium, or polycrystalline silicon germanium). In some embodiments, the first conductive material 807 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the first conductive material 807 may be, for example, titanium nitride, titanium, tungsten, or a combination thereof. By employing a material having good electrical conductivity, the sheet resistance of the cell contact structure 500 may be reduced. As a result, the performance of the semiconductor device 1 may be improved.

With reference to FIGS. 24 and 25, an etching back process may be performed to remove portions of the liner material 805 and the first conductive material 807. After the etching back process, the remaining liner material 805 may be turned into a plurality of liner layers 501 within the plurality of contact openings OP2, respectively and correspondingly. The remaining first conductive material 807 may be turned into a plurality of bottom contact layers 503 within the plurality of contact openings OP2, respectively and correspondingly.

For brevity, clarity, and convenience of description, only one liner layer 501 and one bottom contact layer 503 are described. In some embodiments, in a cross-sectional perspective, the top surface 503TS of the bottom contact layer 503 and the top surface 501TS of the liner layer 501 may be substantially coplanar. The top surface 503TS of the bottom contact layer 503 and the top surface 501TS of the liner layer 501 may be lower than the top surface 307TS of the bit line capping layer 307 (i.e., the top surface of the bit line structure 300). In some embodiments, in a top-view perspective, the liner layer 501 may have a square-ring-shaped or rectangle-ring-shaped cross-sectional profile. The bottom contact layer 503 may have a square-shaped or rectangular cross-sectional profile.

With reference to FIG. 26, a layer of second conductive material 809 may be formed over the substrate 101 to completely fill the plurality of contact openings OP2 and cover the plurality of partition layers 601, the plurality of bit line structures 300, and the plurality of spacer structures 400. In some embodiments, the second conductive material 809 may be, for example, a material having good electrical conductivity (or a material having electrical conductivity better than polycrystalline silicon, polycrystalline germanium, or polycrystalline silicon germanium). In some embodiments, the second conductive material 809 may be the same material as the bottom contact layer 503. In some embodiments, the second conductive material 809 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the second conductive material 809 may be, for example, titanium nitride, titanium, tungsten, or a combination thereof.

With reference to FIGS. 27 and 28, an etching back process may be performed to remove portions of the second conductive material 809. After the etching back process, the remaining second conductive material 809 may be turned into a plurality of top contact layer 505 within the plurality of contact openings OP2, respectively and correspondingly. For brevity, clarity, and convenience of description, only one top contact layer 505 is described. In some embodiments, in a cross-sectional perspective, the top surface 505TS of the top contact layer 505 may be lower than the top surface 307TS of the bit line capping layer 307. In some embodiments, the width W1 of the top contact layer 505 may be greater than the width W2 of the bottom contact layer 503. In some embodiments, in a top-view perspective, the top contact layer 505 may have a square-shaped or rectangle-shaped cross-sectional profile. The liner layer 501, the bottom contact layer 503, and the top contact layer 505 together configure the cell contact structure 500. The cell contact structure 500 may electrically connect to the corresponding drain region 105-3.

By employing the top contact layer 505 formed of a material having good electrical conductivity, the sheet resistance of the cell contact structure 500 may be reduced. As a result, the performance of the semiconductor device 1 may be further improved.

With reference to FIG. 29, the top insulating layer 109 may be formed over the substrate 101 to cover the plurality of partition layers 601, the plurality of cell contact structures 500, the plurality of spacer structures 400, and the plurality of bit line structures 300. In some embodiments, the top insulating layer 109 may be formed of the same material as the bit line capping layer 307. In some embodiments, the top insulating layer 109 may be formed of, for example, silicon nitride or other applicable insulating material.

The utilization of the liner layer 501 formed of doped polycrystalline silicon, doped polycrystalline germanium, or doped polycrystalline silicon germanium, may serve to reduce the junction leakage in the cell contact structure 500. Additionally, the employment of the bottom contact layer 503 and the top contact layer 505 made from materials such as titanium nitride, tungsten, or titanium, may effectively lower the sheet resistance of the cell contact structure 500. These enhancements collectively may improve the performance of the semiconductor device 1A.

Figure 30:
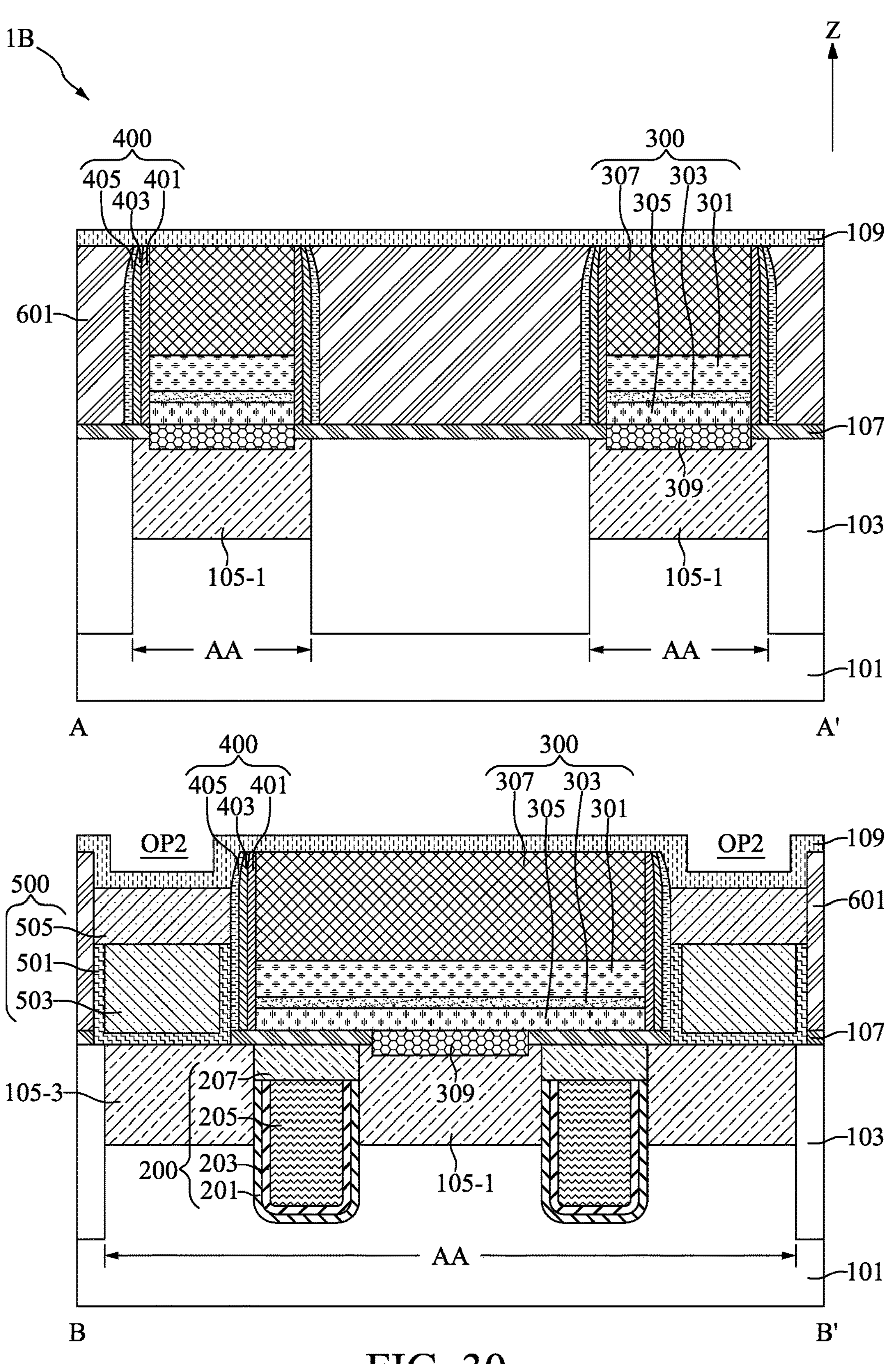
FIGS. 30 to 32 illustrate, in schematic cross-sectional view diagrams, semiconductor devices in accordance with some embodiments of the present disclosure.
Figure 31:
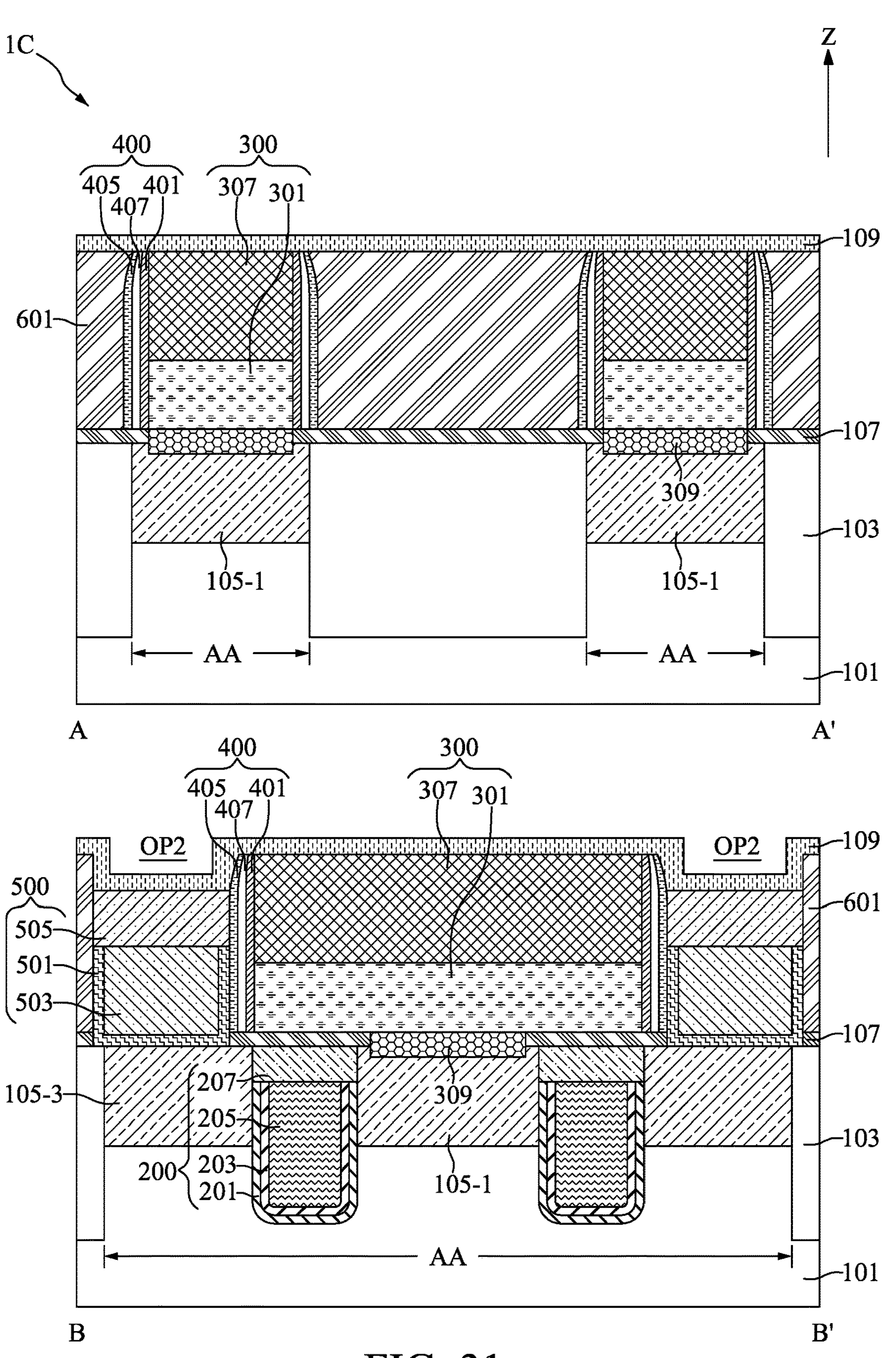
Figure 32:
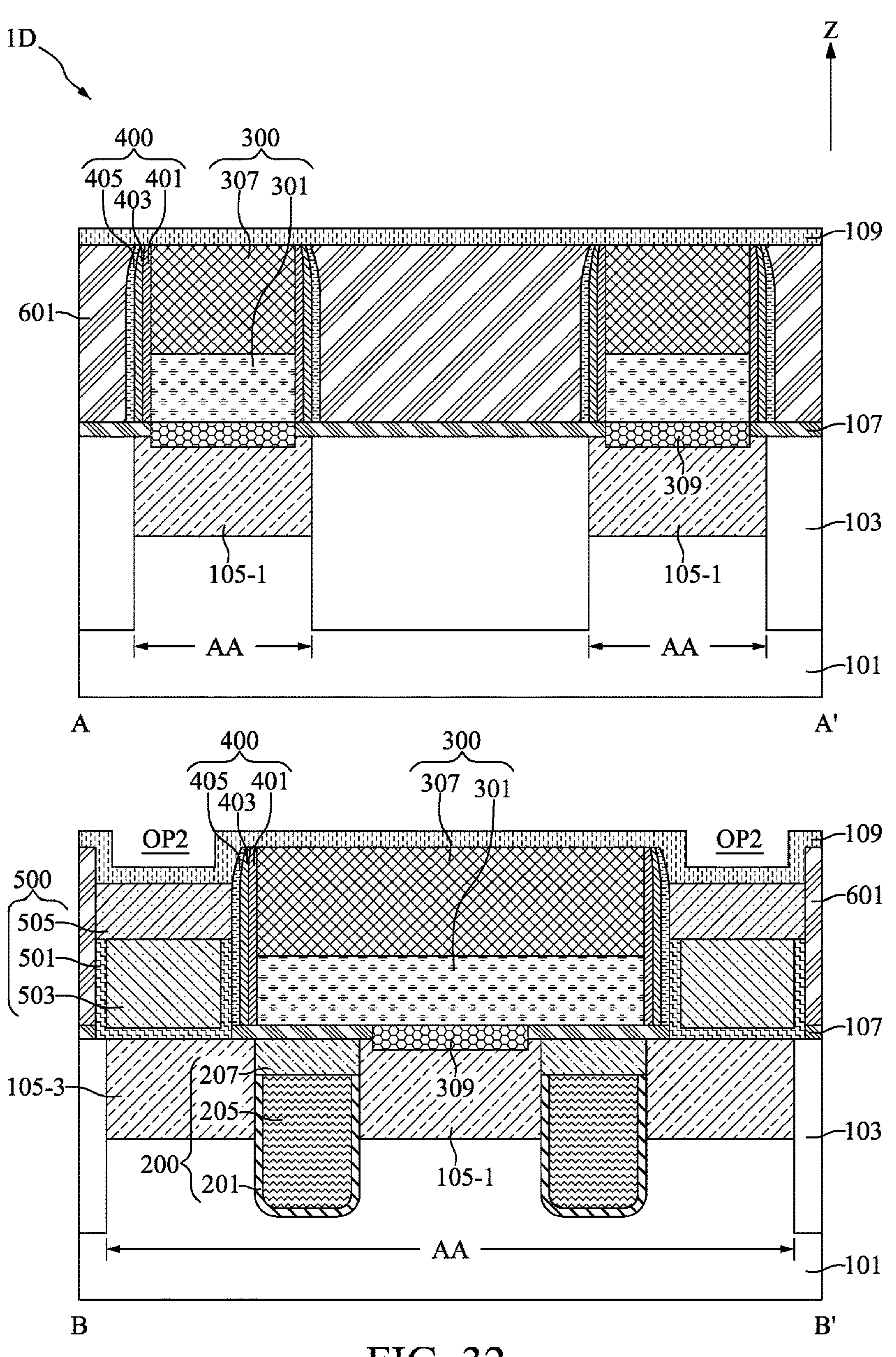

FIGS. 30 to 32 illustrate, in schematic cross-sectional view diagrams, semiconductor devices 1B, 1C, and 1D in accordance with some embodiments of the present disclosure.

With reference to FIG. 30, the semiconductor device 1B may have a structure similar to that illustrated in FIG. 29. The same or similar elements in FIG. 30 as in FIG. 29 have been marked with similar reference numbers and duplicative descriptions have been omitted.

In semiconductor device 1B, the bit line structure 300 may include a bit line bottom conductive layer 305, a bit line middle conductive layer 303, a bit line top conductive layer 301, and a bit line capping layer 307.

The bit line bottom conductive layer 305 may be disposed on the bit line contact 309. In some embodiments, the bit line bottom conductive layer 305 may be formed of, for example, doped polycrystalline silicon, doped polycrystalline germanium, doped polycrystalline silicon germanium, or a combination thereof. In some embodiments, the dopants for the bottom conductive layer 305 may include boron, aluminum, gallium, indium, antimony, arsenic, or phosphorus.

The bit line middle conductive layer 303 may be disposed on the bit line bottom conductive layer 305. In some embodiments, the bit line middle conductive layer 303 may be formed of, for example, titanium silicide, nickel silicide, nickel platinum silicide, tantalum silicide, or cobalt silicide. In some embodiments, the bit line middle conductive layer 303 may have a thickness between about 2 nm and about 20 nm.

The bit line top conductive layer 301 may be disposed on the bit line middle conductive layer 303. In some embodiments, the bit line top conductive layer 301 may be formed of, for example, titanium, nickel, platinum, tantalum, cobalt, silver, copper, aluminum, other applicable conductive material, or a combination thereof.

The bit line capping layer 307 may be disposed on the bit line top conductive layer 301. In some embodiments, the bit line capping layer 307 may be formed of, for example, silicon nitride or other applicable insulating material.

With reference to FIG. 31, the semiconductor device 1C may have a structure similar to that illustrated in FIG. 29. The same or similar elements in FIG. 31 as in FIG. 29 have been marked with similar reference numbers and duplicative descriptions have been omitted.

In the semiconductor device 1C, the plurality of spacer structures 400 may include a plurality of bit line inner spacers 401, a plurality of air gaps 407, and a plurality of bit line outer spacers 405. The plurality of bit line inner spacers 401 may be disposed on sides 300S of the bit line structure 300, respectively and correspondingly. The plurality of bit line outer spacers 405 may be disposed on the plurality of bit line inner spacers 401, respectively and correspondingly. The plurality of air gaps 407 may be disposed between the plurality of bit line inner spacers 401 and the plurality of bit line outer spacers 405. The employment of the plurality of air gaps 407 may reduce the dielectric constant of the spacer structure 400. As a result, parasitic capacitance between adjacent conductive features (e.g., the adjacent bit line structures 300) may be reduced.

With reference to FIG. 32, the semiconductor device 1D may have a structure similar to that illustrated in FIG. 29. The same or similar elements in FIG. 32 as in FIG. 29 have been marked with similar reference numbers and duplicative descriptions have been omitted.

In the semiconductor device 1D, there is no word line barrier layer 203 as shown in the FIG. 29. The word line conductive layer 205 may be directly disposed on the word line dielectric layer 201. In the present embodiment, the word line conductive layer 205 may be formed of titanium nitride.

One aspect of the present disclosure provides a cell contact structure including a bottom contact layer positioned on a substrate and enclosed by a plurality of bit line structures and a plurality of partition layers; a liner layer positioned between the bottom contact layer and the substrate, between the bottom contact layer and the plurality of bit line structures, and between the bottom contact layer and the plurality of partition layers; and a top contact layer positioned on the bottom contact layer and the liner layer. A top surface of the bottom contact layer and a top surface of the liner layer are substantially coplanar. The liner layer includes doped polycrystalline silicon, doped polycrystalline germanium, or doped polycrystalline silicon germanium. The bottom contact layer includes tungsten, titanium, or titanium nitride.

Another aspect of the present disclosure provides a semiconductor device including a substrate; two bit line structures may be formed on the substrate, extending along a first direction, and separated from each other; two partition layers positioned on the substrate, extending along a second direction perpendicular to the first direction, separated from each other along the first direction, and simultaneously contacting the two bit line structures; and a cell contact structure including a bottom contact layer positioned on the substrate and enclosed by the two bit line structures and the two partition layers, a liner layer positioned between the substrate and the bottom contact layer, between the two bit line structures and the bottom contact layer, and between the two partition layer and the bottom contact layer, and a top contact layer positioned on the liner layer and the bottom contact layer. A top surface of the liner layer and a top surface of the bottom contact layer are substantially coplanar. The liner layer includes doped polycrystalline silicon, doped polycrystalline germanium, or doped polycrystalline silicon germanium. The bottom contact layer includes tungsten, titanium, or titanium nitride.

Another aspect of the present disclosure provides a method for fabricating a semiconductor device including providing a substrate; forming two bit line structures on the substrate, extending along a first direction, and separated from each other; forming a plurality of spacer structures on sides of the two bit line structures; forming two partition layers on the substrate, extending along a second direction perpendicular to the first direction, separated from each other, and resulting in a contact opening in conjunction with the plurality of spacer structures; conformally forming a liner layer in the contact opening and within the contact opening; forming a bottom contact layer on the liner layer and within the contact opening; and forming a top contact layer on the liner layer, on the bottom contact layer, and within the contact opening. The liner layer includes doped polycrystalline silicon, doped polycrystalline germanium, or doped polycrystalline silicon germanium. The bottom contact layer includes tungsten, titanium, or titanium nitride. The liner layer, the bottom contact layer, and the top contact layer together configure a cell contact structure.

Due to the design of the semiconductor device of the present disclosure, the junction leakage of the cell contact structure 500 may be reduced by employing the liner layer 501 formed of doped polycrystalline silicon, doped polycrystalline germanium, or doped polycrystalline silicon germanium. In addition, the sheet resistance of the cell contact structure 500 may be reduced by employing the bottom contact layer 503 and the top contact layer 505 formed of titanium nitride, tungsten, or titanium. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate;

forming two bit line structures on the substrate, extending along a first direction, and separated from each other;

forming a plurality of spacer structures on sides of the two bit line structures;

forming two partition layers on the substrate, extending along a second direction perpendicular to the first direction, separated from each other, and resulting in a contact opening in conjunction with the plurality of spacer structures;

conformally forming a liner layer in the contact opening and within the contact opening;

forming a bottom contact layer on the liner layer and within the contact opening; and forming a top contact layer on the liner layer, on the bottom contact layer, and within the contact opening;

wherein the liner layer comprises doped polycrystalline silicon, doped polycrystalline germanium, or doped polycrystalline silicon germanium;

wherein the bottom contact layer comprises tungsten, titanium, or titanium nitride;

wherein the liner layer, the bottom contact layer, and the top contact layer together configure a cell contact structure.

2. The method for fabricating the semiconductor device of claim 1, wherein forming the two partition layers comprises:

forming a sacrificial layer over the substrate to cover the two bit line structures and the plurality of spacer structures;

performing a planarization process until top surfaces of the two bit line structures are exposed;

forming a first mask layer on the sacrificial layer, wherein the first mask layer comprises a line pattern that partially exposes the sacrificial layer, the plurality of spacer structures, and the two bit line structures;

selectively removing the sacrificial layer to form two partition openings;

removing the first mask layer;

forming a layer of partition material to completely fill the two partition openings and cover the two bit line structures and the plurality of spacer structures; and performing a planarization process until the top surfaces of the two bit line structures and the sacrificial layer are exposed to turn the layer of partition material into the two partition layers.

3. The method for fabricating the semiconductor device of claim 2, wherein the sacrificial layer comprises silicon oxynitride or silicon nitride oxide.

4. The method for fabricating the semiconductor device of claim 2, wherein the partition material comprises silicon nitride.

5. The method for fabricating the semiconductor device of claim 2, further comprising selectively removing the sacrificial layer to form the contact opening.

6. The method for fabricating the semiconductor device of claim 5, wherein forming the plurality of spacer structures comprises:

forming a plurality of bit line inner spacers on the sides of the two bit line structures;

forming a plurality of bit line middle spacers on the plurality of bit line inner spacers; and forming a plurality of bit line outer spacers on the plurality of bit line middle spacers.

7. The method for fabricating the semiconductor device of claim 6, wherein the plurality of bit line inner spacers and the plurality of bit line middle spacers comprise the same material.

8. The method for fabricating the semiconductor device of claim 6, the top contact layer comprises tungsten, titanium, or titanium nitride.

9. The method for fabricating the semiconductor device of claim 6, wherein the top contact layer comprises the same material as the bottom contact layer.

10. The method for fabricating the semiconductor device of claim 6, wherein the liner layer comprises n-type dopants or p-type dopants.

* * * * *